(12) United States Patent
Park et al.

(10) Patent No.: US 11,784,131 B2
(45) Date of Patent: *Oct. 10, 2023

(54) INTERPOSER AND SEMICONDUCTOR PACKAGE INCLUDING THE SAME

(71) Applicant: SAMSUNG ELECTRONICS CO., LTD., Suwon-si (KR)

(72) Inventors: Yukyung Park, Hwaseong-si (KR); Minseung Yoon, Yongin-si (KR); Yunseok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 133 days.

This patent is subject to a terminal disclaimer.

(21) Appl. No.: 17/163,988

(22) Filed: Feb. 1, 2021

(65) Prior Publication Data

US 2021/0391269 A1  Dec. 16, 2021

(30) Foreign Application Priority Data

Jun. 16, 2020 (KR) .................. 10-2020-0073248

(51) Int. Cl.
  *H01L 23/52* (2006.01)
  *H01L 23/538* (2006.01)
  *H01L 23/498* (2006.01)
  *H01L 23/367* (2006.01)

(52) U.S. Cl.
  CPC ...... *H01L 23/5386* (2013.01); *H01L 23/3675* (2013.01); *H01L 23/49822* (2013.01); *H01L 23/49838* (2013.01); *H01L 23/5383* (2013.01)

(58) Field of Classification Search
  CPC ............ H01L 23/5386; H01L 23/3675; H01L 23/49822; H01L 23/49838; H01L 23/5383
  See application file for complete search history.

(56) References Cited

U.S. PATENT DOCUMENTS 8,298,944 B1   10/2012 West
9,666,551 B1 *  5/2017 Seo ................ H01L 23/481
10,079,157 B2 *  9/2018 Paek .............. H01L 21/486
(Continued)

FOREIGN PATENT DOCUMENTS

JP   2009-295850   12/2009
KR   10-1247986    3/2013
KR   10-1411734    6/2014

*Primary Examiner* — Nicholas J Tobergte
(74) *Attorney, Agent, or Firm* — F. Chau & Associates, LLC

(57) ABSTRACT

An interposer includes a base layer including a first surface and a second surface that are opposite to each other. An interconnect structure is disposed on the first surface. The interconnect structure includes a metal interconnect pattern and an insulating layer surrounding the metal interconnect pattern. A first lower protection layer is disposed on the second surface. A plurality of lower conductive pads is disposed on the first lower protection layer. A plurality of through electrodes penetrates the base layer and the first lower protection layer. The plurality of through electrodes electrically connects the metal interconnect pattern of the interconnect structure to the lower conductive pads. At least one of the insulating layer and the first lower protection layer has compressive stress. A thickness of the first lower protection layer is in a range of about 13% to about 30% of a thickness of the insulating layer.

11 Claims, 21 Drawing Sheets

(56) References Cited

U.S. PATENT DOCUMENTS

| | | | |
|---|---|---|---|
| 10,147,682 B2 | 12/2018 | Kao et al. | |
| 11,081,440 B2* | 8/2021 | Park | H01L 21/4853 |
| 11,195,785 B2* | 12/2021 | Park | H01L 23/3121 |
| 11,587,859 B2* | 2/2023 | Park | H01L 24/81 |
| 2014/0293564 A1* | 10/2014 | Murayama | H05K 1/0271 |
| | | | 361/767 |
| 2019/0385982 A1 | 12/2019 | Lee et al. | |
| 2020/0212006 A1* | 7/2020 | Chang | H01L 25/50 |
| 2020/0312760 A1* | 10/2020 | Park | H01L 23/49838 |
| 2021/0167001 A1* | 6/2021 | Park | H01L 21/4857 |
| 2022/0051970 A1* | 2/2022 | Park | H01L 24/81 |

* cited by examiner

INTERPOSER AND SEMICONDUCTOR PACKAGE INCLUDING THE SAME

CROSS-REFERENCE TO RELATED APPLICATION

This application claims priority under 35 U.S.C. § 119 to Korean Patent Application No. 10-2020-0073248, filed on Jun. 16, 2020 in the Korean Intellectual Property Office, the disclosure of which is incorporated by reference in its entirety herein.

1. Technical Field

The present inventive concepts relate to an interposer and a semiconductor package including the same, and more particularly, to an interposer that controls warpage and a semiconductor package including the interposer.

2. Discussion of Related Art

As the size of a semiconductor wafer, such as a silicon wafer, increases the semiconductor wafer may be bent. For example, when an interposer having a relatively large size is manufactured, or when semiconductor package processes utilize an interposer, warpage may occur in the interposer and/or the semiconductor package due to a difference between coefficients of thermal expansion (CTE) of components forming the interposer or the semiconductor package.

SUMMARY

The present inventive concepts include an interposer having increased reliability h controlling warpage, and a semiconductor package including the interposer.

According to an exemplary embodiment of the present inventive concepts, an interposer includes a base layer including a first surface and a second surface that are opposite to each other. An interconnect structure is disposed on the first surface of the base layer. The interconnect structure includes a metal interconnect pattern and an insulating layer surrounding the metal interconnect pattern. A first lower protection layer is disposed on the second surface of the base layer. A plurality of lower conductive pads is disposed on the first lower protection layer. A plurality of through electrodes penetrates the base layer and the first lower protection layer. The plurality of through electrodes is configured to electrically connect the metal interconnect pattern of the interconnect structure to the plurality of lower conductive pads. At least one of the insulating layer and the first lower protection layer have compressive stress. A thickness of the first lower protection layer is in a range of about 13% to about 30% of a thickness of the insulating layer.

According to an exemplary embodiment of the present inventive concepts, an interposer includes a base layer including a first surface and a second surface that are opposite to each other. An interconnect structure is disposed on the first surface of the base layer. The interconnect structure includes a metal interconnect pattern and an insulating layer surrounding the metal interconnect pattern. A first lower protection layer is disposed on the second surface of the base layer. A plurality of lower conductive pads is disposed on the first lower protection layer. A plurality of through electrodes penetrates the base layer and the first lower protection layer. The plurality of through electrodes is configured to electrically connect the metal interconnect pattern of the interconnect structure to the plurality of lower conductive pads. A conductive dummy pattern is disposed on the first lower protection layer. The conductive dummy pattern is separated from the plurality of lower conductive pads and the plurality of through electrodes.

According to an exemplary embodiment of the present inventive concepts, a semiconductor package includes a base layer including a first surface and a second surface that are opposite to each other. An interconnect structure is disposed on the first surface of the base layer and includes a metal interconnect pattern and an insulating layer surrounding the metal interconnect pattern. The insulating layer has compressive stress. A first semiconductor device and a second semiconductor device are mounted on the interconnect structure and are configured to be electrically connected to the metal interconnect pattern. A first lower protection layer is disposed on the second surface of the base layer. The first lower protection layer has compressive stress. A plurality of lower conductive pads is disposed on the first lower protection layer. A plurality of through electrodes penetrates the base layer and the first lower protection layer. The plurality of through electrodes is configured to electrically connect the metal interconnect pattern of the interconnect structure to the plurality of lower conductive pads. A second lower protection layer is disposed on the first lower protection layer and the plurality of lower conductive pads. The second lower protection layer contacts side surfaces of the plurality of lower conductive pads and the first lower protection layer and has an opening defined in the second lower protection layer. A plurality of connection terminals is connected to the plurality of lower conductive pads through the opening of the second lower protection layer. A package substrate is connected to the plurality of connection terminals. Each of the insulating layer and the first lower protection layer includes an inorganic material. The second lower protection layer includes an organic material.

BRIEF DESCRIPTION OF THE DRAWINGS

Exemplary embodiments of the present inventive concepts will be more clearly understood from the following detailed description taken in conjunction with the accompanying drawings in which.

DETAILED DESCRIPTION OF EXEMPLARY EMBODIMENTS

Figure 1A:
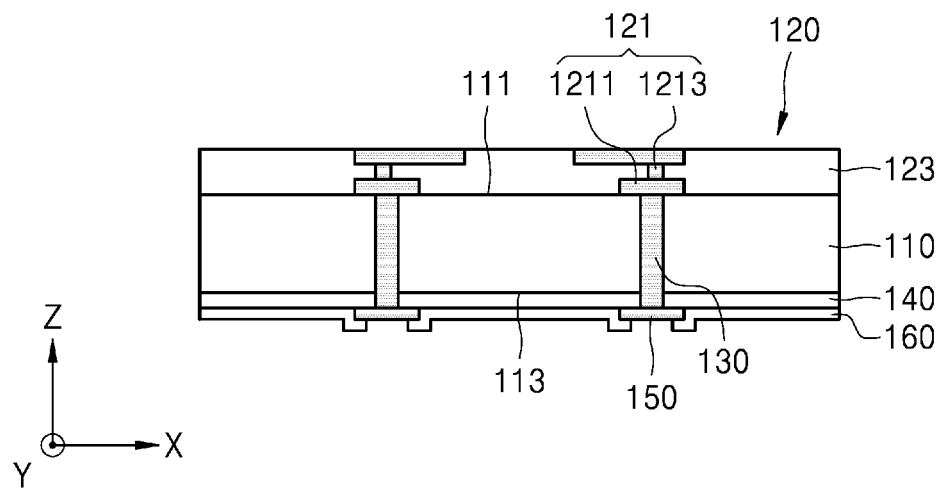
FIGS. 1A to 3B are cross-sectional views of a control method of warpage of an interposer, according to one or more exemplary embodiments of the present inventive concepts.

Hereinafter, one or more exemplary embodiments of the present inventive concepts will be described in detail with reference to the attached drawings. Like reference numerals in the drawings denote like elements, and the descriptions thereof will be omitted.

FIGS. 1A to 3B are conceptual cross-sectional views of a control method of warpage of an interposer, according to exemplary embodiments of the present inventive concepts.

Figure 1B:
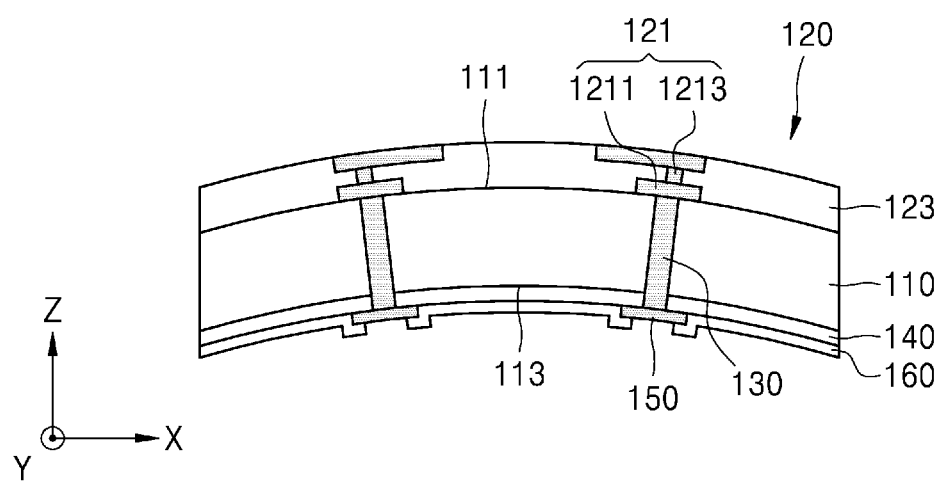

FIGS. 1A and 1B are conceptual cross-sectional views of warpage of a first interposer 10 according to a temperature change. FIG. 1A illustrates the first interposer 10 having a first temperature, and FIG. 1B illustrates the first interposer 10 having a second temperature. The second temperature is higher than the first temperature. For example, in an exemplary embodiment, the first temperature may be in a range of about 20° C. to about 25° C., and the second temperature may be in a range of about 100° C. to about 400° C. However, exemplary embodiments of the present inventive concepts are not limited thereto.

Referring to the exemplary embodiments of FIGS. 1A and 1B, the first interposer 10 may include a base layer 110. In an exemplary embodiment, the base layer 110 may include at least one material selected from a semiconductor material, glass, ceramic, or plastic. In an exemplary embodiment, the base layer 110 may include a silicon wafer including silicon (Si), such as crystalline silicon, polycrystalline silicon or amorphous silicon. The base layer 110 may be substantially flat (e.g., having an upper surface extending substantially in a horizontal direction, such as the X and/or Y directions) and may include a first surface 111 and a second surface 113 that are opposite to each other. For example, as shown in the exemplary embodiment of FIG. 1A, the first surface 111 may be an upper surface of the base layer 110 and the second surface 113 may be a lower surface of the base layer 110. The first surface 111 and the second surface 113 may be spaced apart from each other in the Z direction which is a thickness direction of the base layer 110.

The first interposer 10 may include an interconnect structure 120 disposed on the first surface 111 of the base layer 110. For example, the interconnect structure 120 may have a back-end-of-line (BEOL) structure. The interconnect structure 120 may include an insulating layer 123, which is disposed on the first surface 111 of the base layer 110, and a metal interconnect pattern 121 that is surrounded by the insulating layer 123.

The first interposer 10 may include a first lower protection layer 140 disposed on the second surface 113 of the base layer 110 and a plurality of lower conductive pads 150 disposed on the first lower protection layer 140. The lower conductive pads 150 may be electrically connected to the metal interconnect pattern 121 via through electrodes 130 penetrating the base layer 110 and the first lower protection layer 140.

The first interposer 10 may include a second lower protection layer 160 disposed on the first lower protection layer 140 and the lower conductive pads 150. The second lower protection layer 160 may cover a lower surface of the first lower protection layer 140 and partial portion of each lower conductive pad 150. For example, as shown in the exemplary embodiment of FIG. 1A, the second lower protection layer 160 may cover side surfaces of the lower conductive pads 150, such as lateral end portions of the lower surface of the lower conductive pads 150 and sidewalls of the lower conductive pads 150.

As illustrated in the exemplary embodiments of FIGS. 1A and 1B, a temperature change of the first interposer 10 may cause warpage of the first interposer 10. For example, while the first interposer 10 is heated from a first temperature to a second temperature, the first interposer to may be deformed and may change from a substantially planar (e.g., flat) shape to an upwardly convex shape due to a rapid thermal expansion of the metal interconnect pattern 121 of the interconnect structure 120.

Figure 2A:
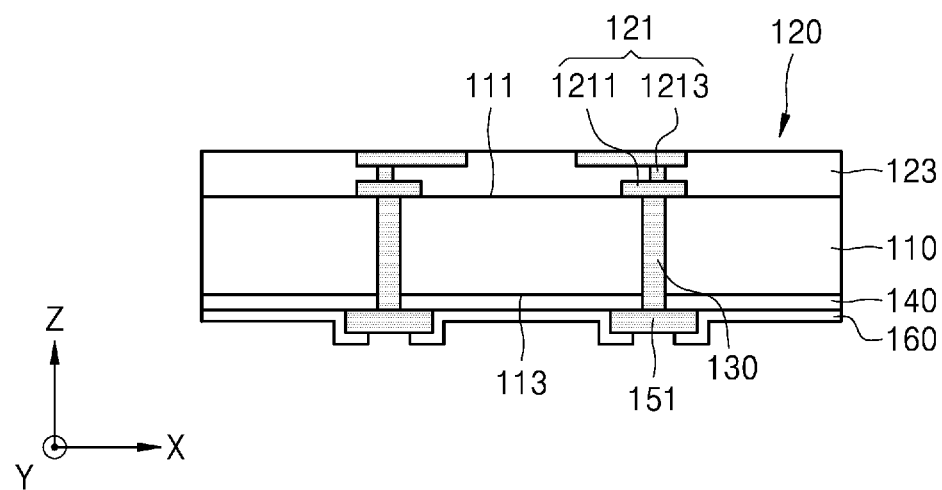
Figure 2B:
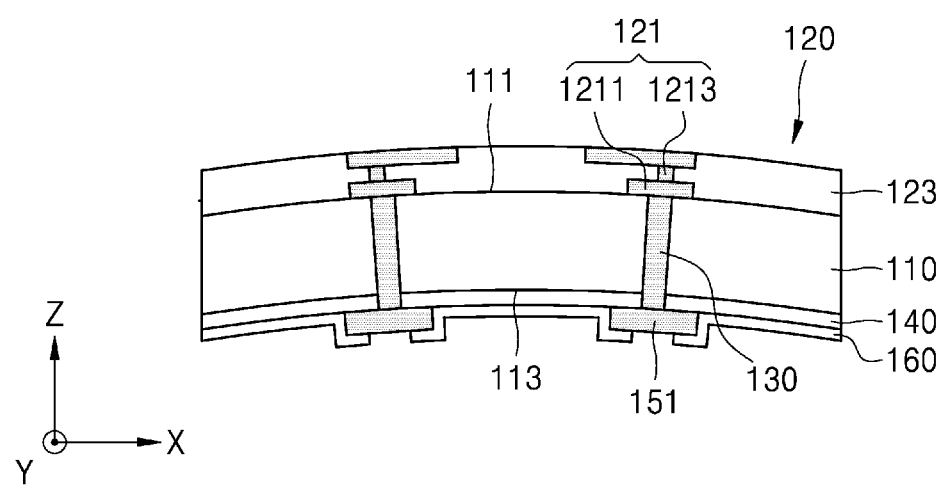

FIGS. 2A and 2B are conceptual cross-sectional views illustrating warpage according to a temperature change of a second interposer 20. FIG. 2A illustrates the second interposer 20 having a first temperature, and FIG. 2B illustrates the second interposer 20 having a second temperature. The first temperature and the second temperature in FIGS. 2A and 2B may the same as the first temperature and second temperature in FIGS. 1A and 1B.

Referring to the exemplary embodiments of FIGS. 2A and 2B, the total volume of the lower conductive pads 151 of the second interposer 20 is greater than the total volume of the lower conductive pads 150 of the first interposer 10 shown in the exemplary embodiments of FIGS. 1A and 1B.

In an exemplary embodiment, the total volume of the lower conductive pads 151 of the second interposer 20 may be similar to the total volume of the metal interconnect pattern 121. For example, in an exemplary embodiment, the total volume of the lower conductive pads 151 of the second interposer 20 may be in a range of about 70% to about 100% of the total volume of the metal interconnect pattern 121.

While the second interposer 20 is heated from the first temperature to the higher second temperature, the thermal expansion of the metal interconnect pattern 121 causes a first warpage to make the second interposer 20 change from a substantially planar (e.g., flat) shape to an upwardly convex shape, and the thermal expansion of the lower conductive pads 151 may cause a second warpage to make the second interposer 20 change from a substantially plan (e.g., flat) shape to a downwardly convex shape. The second warpage caused by the thermal expansion of the lower conductive pads 151 and the first warpage caused by the thermal expansion of the metal interconnect pattern 121 work in opposite directions. Therefore, the second warpage may cancel or decrease the first warpage. For example, the angle of the upwardly convex shape caused by the warpage of the second interposer 20 in the exemplary embodiment of FIG. 2B may be less than the angle of the upwardly convex shape caused by the warpage of the first interposer 120 in the exemplary embodiment of FIG. 1B.

Figure 3A:
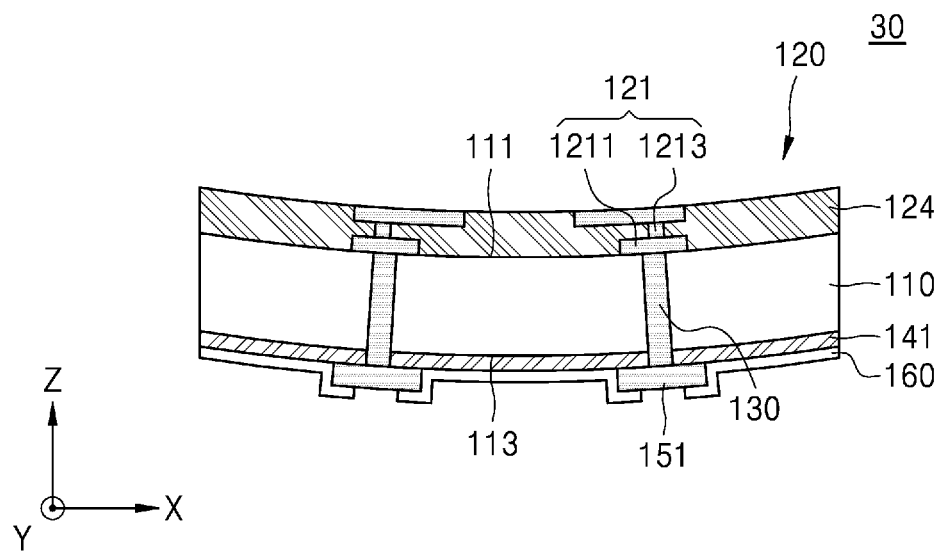
Figure 3B:
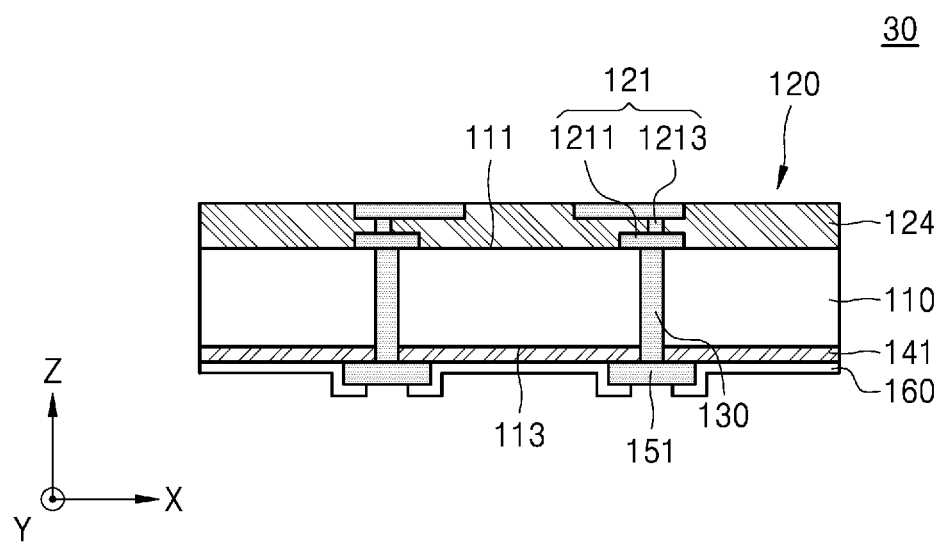

FIGS. 3A and 3B are conceptual cross-sectional views illustrating warpage according to a temperature change of a third interposer 30. FIG. 3A illustrates the third interposer 30 having a first temperature, and FIG. 3B illustrates the third interposer 30 having a second temperature. The first temperature and the second temperature in FIGS. 3A and 3B may the same as the first temperature and second temperature in FIGS. 1A and 1B.

Referring to the exemplary embodiments of FIGS. 3A and 3B, the third interposer 30 is different from the second interposer 20 in the exemplary embodiments of FIGS. 2A and 2B based on at least one of an insulating layer 124 and a first lower protection layer 141 of the third interposer 30 having compressive stress. For example, as shown in the exemplary embodiment of FIG. 3A, the third interposer 30 may have compressive stress applied on both the insulating layer 124 and the first lower protection layer 141 so that the third interposer 30 has a shape that is downwardly convex when the first temperature is applied.

The insulating layer 124 and the first lower protection layer 141 may each be a material layer to which compressive stress is applied. Thus, the insulating layer 124 and the first lower protection layer 141 may have compressive stress. In an exemplary embodiment, the insulating layer 124 and the first lower protection layer 141 may have the compressive stress applied by performing a Plasma-Enhanced Chemical Vapor Deposition (PECVD) process. In an exemplary embodiment, the insulating layer 124 and the first lower protection layer 141 may include inorganic insulating materials. For example, in an exemplary embodiment, the insulating layer 124 and the first lower protection layer 141 may include silicon oxide, silicon nitride, or a combination thereof.

The insulating layer 124 and/or the first lower protection layer 141 may provide the compressive stress that is opposite to the tensile stress generated ire the third interposer 30. The compressive stress works in air opposite direction to the tensile stress, and when the tensile stress has a positive value, the compressive stress has a negative value. In general, the metal interconnect pattern 121 and the lower conductive pads 151, which include metal, have the tensile stress, and the compressive stress provided by the insulating layer 124 and the first lower protection layer 141 may cancel or decrease the tensile stress generated in the metal interconnect pattern 121 and the lower conductive pads 151.

The tensile stress provided by the metal interconnect pattern 121 and the lower conductive pads 151 may cause a third warpage by which the third interposer 30 is deformed to be convex upwards, and the compressive stress provided by the insulating layer 124 and the first lower protection layer 141 may cause a fourth warpage by which the third interposer 30 is deformed to be convex downwards. The fourth warpage caused, by the compressive stress and the third warpage caused by the tensile stress extend in opposite directions, and thus, the fourth warpage caused by the compressive stress provided by the insulating layer 124 and the first lower protection layer 141 may cancel or decrease the third warpage caused by the tensile stress provided by the metal interconnect pattern 121 and the lower conductive pads 151. For example, as shown in the exemplary embodiment of FIGS. 3A and 3B, the third interposer 30 may have a shape that is downwardly convex when the first temperature is applied due to compressive stress provided by the insulating layer 124 and/or the first lower protection layer 141. When the third interposer 30 is heated to the second temperature the tensile stress provided by the metal interconnect pattern 121 and the lower conductive pads 151 causes the third interposer 30 to be deformed in an upwardly convex shape. However, the tensile stress on the third interposer 30 is cancelled by the compressive stress on the third interposer 30 such that the third interposer 30 has a shape that is substantially flat at the second temperature.

Figure 4:
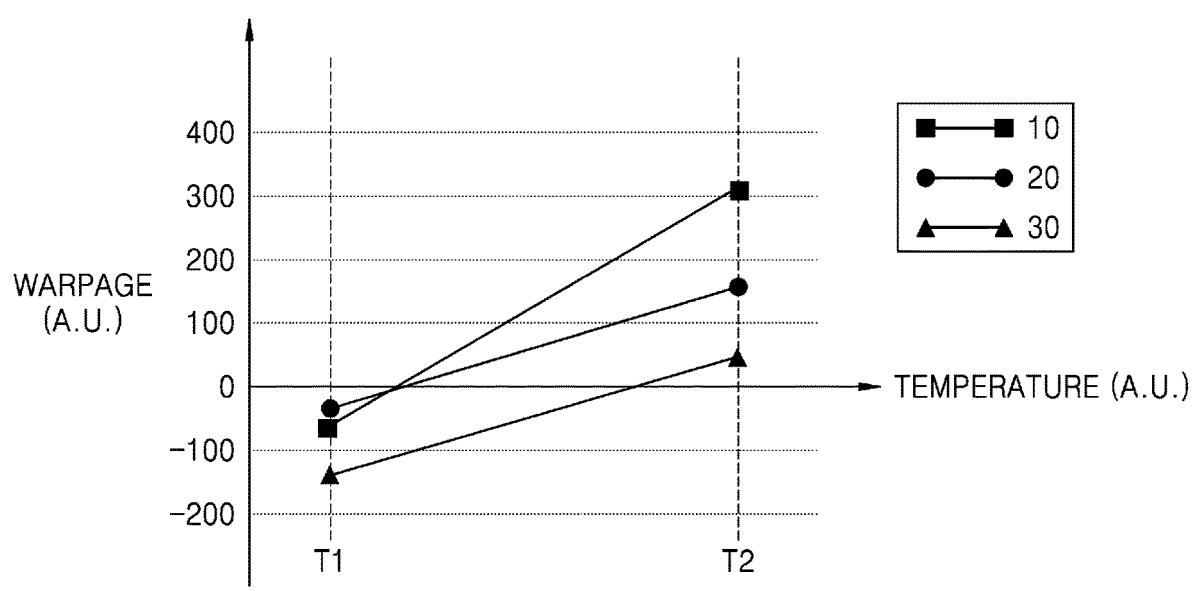
FIG. 4 is a graph of an example of warpage changes according to temperature changes of first to third interposers of FIGS. 1A to 3B according to an exemplary embodiment of the present inventive concepts.

FIG. 4 is a graph showing warpage changes according to temperature changes of the first to third interposers 10 to 30 of the exemplary embodiments of FIGS. 1A to 3B. Hereinafter, referring to FIG. 4 along with FIGS. 1A to 3B, the warpage changes according to the temperature changes of the first to third interposers 10 to 30 will be described.

In the graph of FIG. 4, the horizontal axis indicates a temperature of an interposer, and the vertical axis indicates a sin of warpage caused in the interposer. For convenience of explanation, when the interposer is deformed to be convex upwards (e.g., a central portion of the interposer is deformed to be convex upwards with respect to the lateral edges of the interposer), the warpage generated in the interposer is defined as having a positive value. When the interposer is deformed to be convex downwards (e.g., a central portion of the interposer is deformed to be convex downwards with respect to lateral edges of the interposer), the warpage generated in the interposer is defined as having a negative value. When the interposer is planar (e.g., flat), a value of warpage generated in the interposer is defined as being zero (0).

Referring to the exemplary embodiments of FIGS. 1A, 1B, and 4, while the first interposer 10 is heated from the first temperature T1 to the second temperature T2, the metal interconnect pattern 121 of the interconnect structure 120 thermally expands. Due to the thermal expansion of the metal interconnect pattern 121, the first interposer 10 may be deformed to be convex upwards. As the temperature of the first interposer 10 increases, the warpage of the first interposer 10 may gradually increase.

For example, as illustrated in FIG. 4, the warpage of the first interposer 10 may have a negative value at the first temperature T1. The warpage of the first interposer 10 may gradually increase according to a temperature increase and may have a positive value at the second temperature T2. For example, as shown in the exemplary embodiment of FIG. 4, the first interposer 10 may have a positive value of approximately 300 at the second temperature T2.

Referring to the exemplary embodiments of FIGS. 2A, 2B, and 4, by adjusting a ratio of the total volume of the metal interconnect pattern 121 and the total volume of the lower conductive pads 151, a range of the warpage according to the temperature change may be adjusted. For example, by adjusting the total volume of the lower conductive pads 151 to be close to the total volume of the metal interconnect pattern 121, a range of the warpage of the second interposer 20 according to a temperature change may be less than a range of the warpage of the first interposer 10 of the exemplary embodiments of FIGS. A and 1B according to a temperature change, as in the graph of FIG. 4.

For example, as illustrated in FIG. 4, the warpage of the first interposer 10 may be similar to the warpage of the second interposer 20 at the first tempo attire T1. However, because the range of the warpage of the second interposer 20 according to a temperature increase is less than the range of the first interposer 10, an absolute value of the warpage of the second interposer 20 may be less than an absolute value of the warpage of the first interposer 10 at the second temperature T2. For example, since the second interposer 20 is less deformed than the first interposer 10 at the second temperature T2, the second interposer 20 may be more advantageous for performing a process such as a chip mount process, in which a high temperature is applied, as compared to the first interposer 10.

Referring to the exemplary embodiments of FIGS. 3A, 3B, and 4, as the compressive stress is applied to the insulating layer 124 and the first lower protection layer 141, the warpage of the third interposer 30 may decrease.

For example, as illustrated in FIG. 4, as the compressive stress is applied by the insulating layer 124 and the first lower protection layer 141, an absolute value of the warpage of the third interposer 30 may be greater than an absolute value of the warpage of the second interposer 20 of the exemplary embodiments of FIGS. 2A and 2B at the first temperature T1. For example, the third interposer 30 may be deformed to have a shape that is downwardly convex at the first temperature T1 at a greater angle than the second interposer 20 at the first temperature T1. Therefore, the third interposer 30 may have a negative warpage of about −140 at the first temperature T1 whereas the second interposer 20 has a negative warpage of about −40 at the first temperature T1. While the second and third interposers 20 and 30 are heated from the first temperature T1 to the second temperature T2, the range of the warpage of the second interposer 20 is almost similar to the range of the warpage of the third interposer 30, and thus, the absolute value of the warpage of the third interposer 30 may be less than the absolute value of the warpage of the second interposer 20 at the second temperature T2. For example, the third interposer 30 may have a positive warpage of about 50 at the second temperature T2 whereas the second interposer has a positive warpage of about 150 at the second temperature T2. Since the third interposer 30 is less deformed than the second interposer 20 at the second temperature T2, the third interposer 30 may be more advantageous to perform a process such as a chip mount process, in which a high temperature is applied, compared to the second interposer 20.

Recently, due to an increase in a demand for semiconductor packages which provide a system having a high memory bandwidth, and a demand for improvements in the signal integrity and power integrity of an interposer, a volume of a metal interconnect pattern of the interposer has gradually increased. As the volume of the metal interconnect pattern of the interposer increases, warpage may excessively occur in the interposer due to the tensile stress provided as the temperature increases.

However, according to an exemplary embodiment of the present inventive concepts, the warpage of the interposer may be controlled by adjusting (i) a ratio of the total volume of the lower conductive pads 151 to the total volume of the metal interconnect pattern 121 and/or (ii) compressive stress and a thickness of the insulating layer 124 and the first lower protection layer 141. For example, in all temperature sections that are predetermined, the ratio of the total volume of the lower conductive pads 151 to the total volume of the metal interconnect pattern 121 may be adjusted, and the compressive stress applied to the insulating layer 124 and the first lower protection layer 141 may be adjusted so that the warpage of the interposer in the predetermined temperature sections may be in a preset range (e.g., between about −70 μm and about +70 μm). Since the warpage of the interposer is controllable, the reliability of the interposer and that of a semiconductor package including the interposer may be increased.

Figure 5:
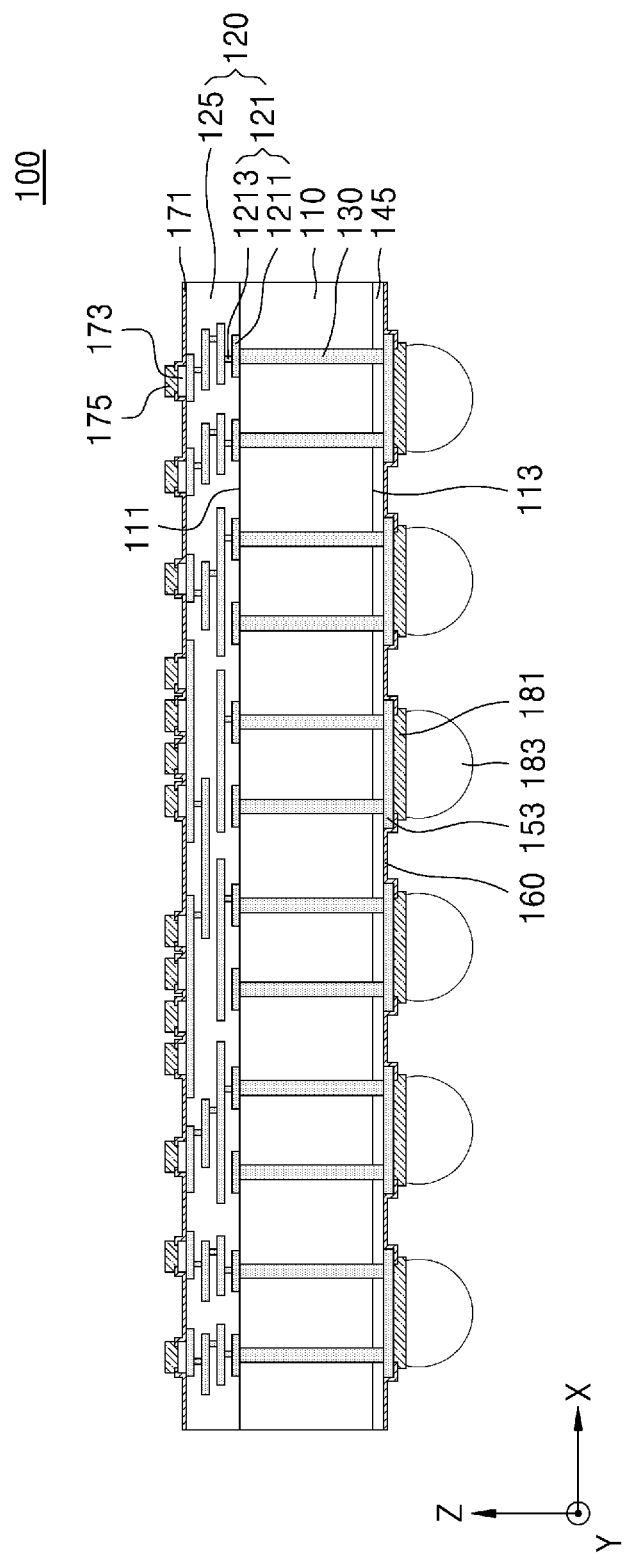
FIG. 5 is a cross-sectional view of an interposer according to an exemplary embodiment of the present inventive concepts.
Figure 6:
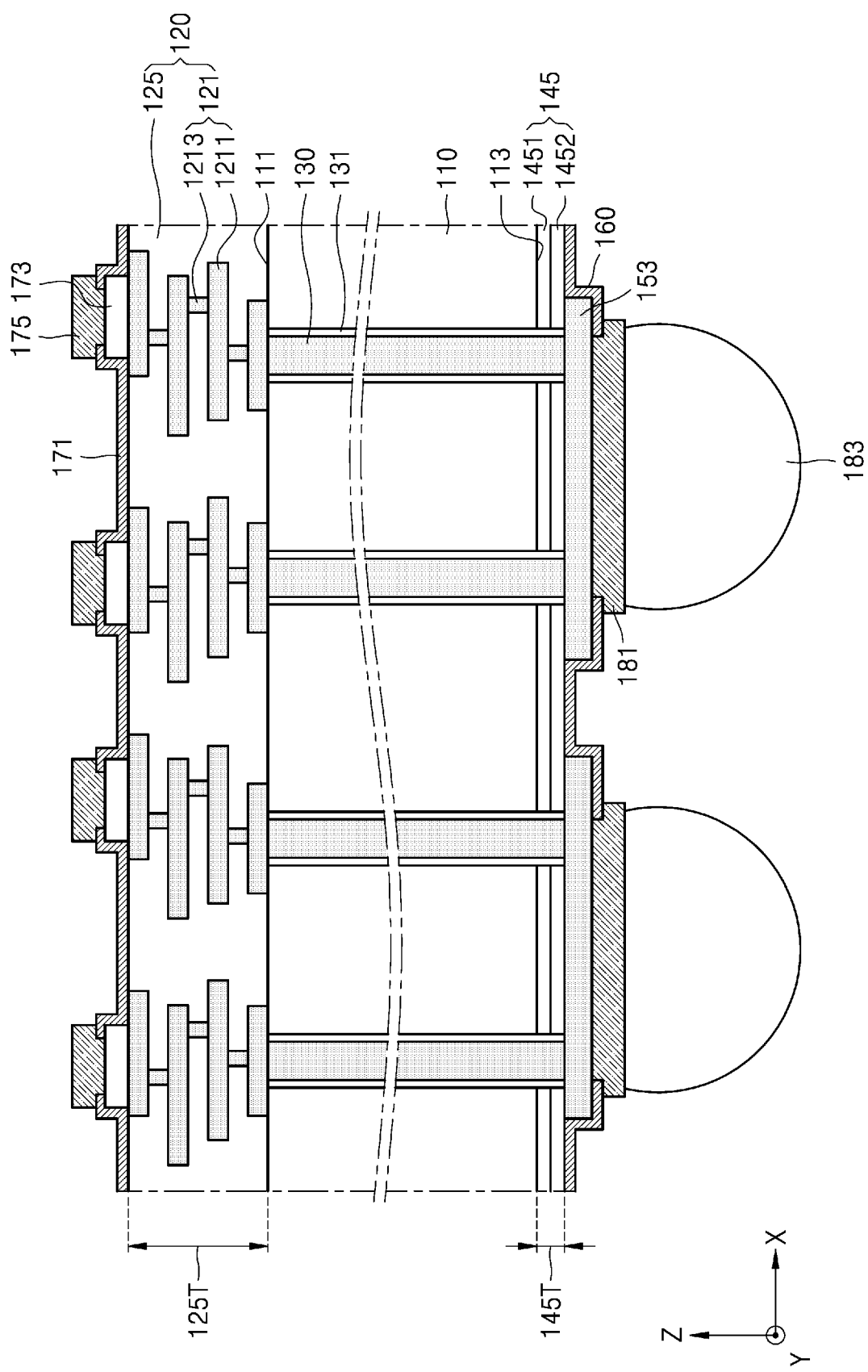
FIG. 6 is an enlarged view of a partial portion of the interposer of FIG. 5 according to an exemplary embodiment of the present inventive concepts.
Figure 7:
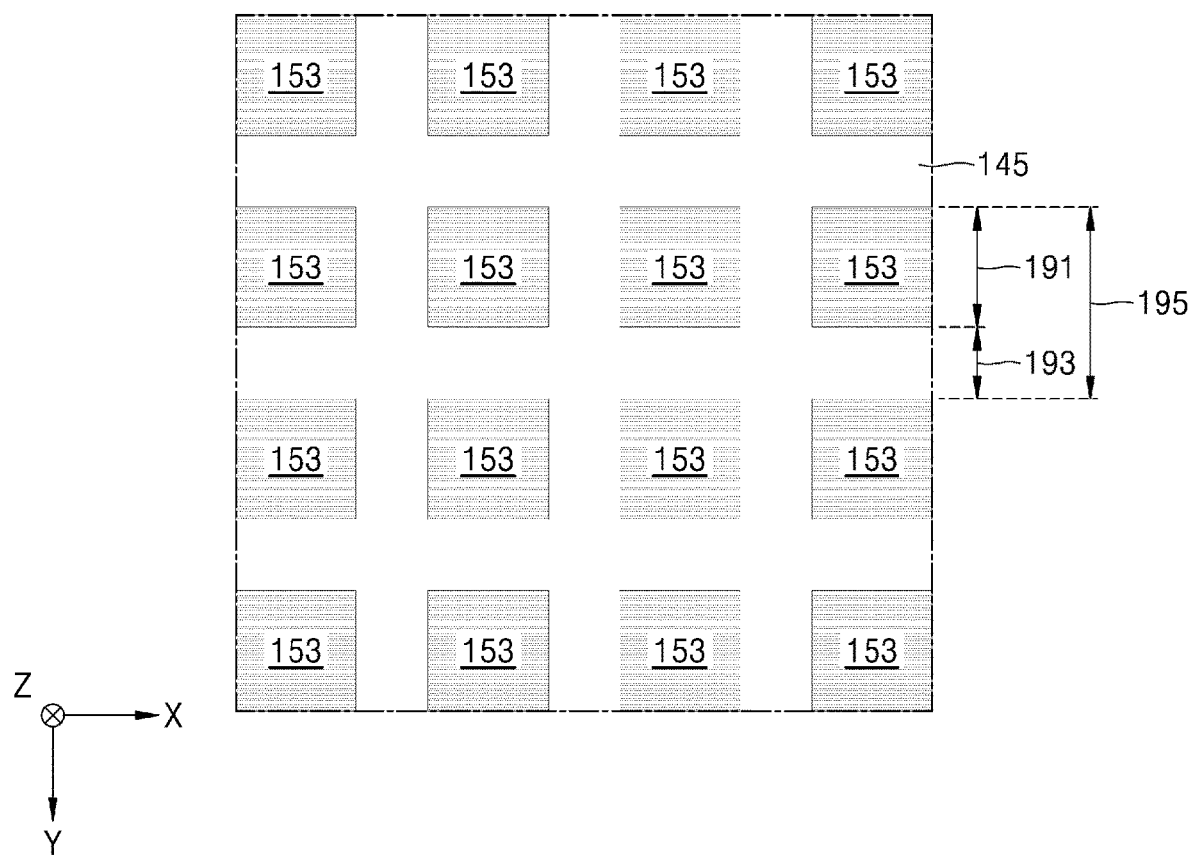
FIG. 7 is a plan view of an example arrangement of lower conductive pads according to an exemplary embodiment of the present inventive concepts.

FIG. 5 is a cross-sectional view of an interposer 100 according to an exemplary embodiment of the present inventive concepts. FIG. 6 is an enlarged view illustrating an enlarged portion of the interposer 100 of FIG. 5 according to an exemplary embodiment of the present inventive concepts. FIG. 7 is a plan view of an example arrangement of lower conductive pads 153 according to an exemplary embodiment of the present inventive concepts. Hereinafter, for convenience of explanation, the descriptions provided above for substantially identical elements will be omitted or simplified.

Referring to the exemplary embodiments of FIGS. 5 to 7, the interposer 100 may include the base layer 110, the interconnect structure 120, the through electrodes 130, a first lower protection layer 145, the lower conductive pads 153, and the second lower protection layer 160.

The interconnect structure 120 may be disposed on the first surface 111 of the base layer 110 and may include the insulating layer 125, which covers the first surface 111 of the base layer 110, and the metal interconnect pattern 121, which is surrounded by the insulating layer 125.

In an exemplary embodiment, the insulating layer 125 may include an inorganic insulating, material to which compressive stress is applied. In an exemplary embodiment, the insulating layer 125 may have compressive stress alter a Plasma-Enhanced Chemical Vapor Deposition (PECVD) process. For example, the insulating layer 125 may include at least one of oxide and nitride. For example, in an exemplary embodiment the insulating layer 175 may include at least one of silicon oxide and silicon nitride. To adjust the compressive stress of the insulating layer 125, process conditions of the PECVD process for forming the insulating layer 125 and/or a thickness of the insulating layer 125 may be adjusted.

In an exemplary embodiment, the compressive stress of the insulating layer 125 may be in a range of about 150 MPa to about 250 MPa.

In an exemplary embodiment, a thickness of the insulating layer 125 in the Z direction which is perpendicular to the first surface 111 of the base layer 110 may be in a range of about 8 μm to about 12 μm. For example, in an exemplary embodiment, the thickness of the insulating layer 125 at the first direction may be about 10 μm.

The metal interconnect pattern 121 may include conductive line patterns 1211, which are disposed at different levels in the insulating layer 125 (e.g., different distances from the first surface 111 in the Z direction) and form a multilayered structure. The metal interconnect pattern 121 also includes conductive vias 1213 extending in a vertical direction (e.g., extending substantially in the Z direction) in the insulating layer 125 to electrically connect the conductive line patterns 1211 to each other. FIG. 5 illustrates that the metal interconnect pattern 121 includes the conductive line patterns 1211 which form a four-layer structure. However, exemplary embodiments of the present inventive concepts are not limited thereto and the number of the conductive line patterns 1211 disposed on different levels may vary in other exemplary embodiments. For example, the metal interconnect pattern 121 may include the conductive line patterns 1211 forming a multi-layered structure of two, three, or live or more layers. In an exemplary embodiment, the conductive line patterns 1211 and conductive vias 1213 may each include at least one metal selected from the group consisting of tungsten (W), aluminum (Al), and copper (Cu).

The first lower protection layer 145 may be disposed on and cover the second surface 113 of the base layer 110. The first lower protection layer 145 may include upper and lower surfaces that are opposite to each other (e.g., in the Z direction). The upper surface of the first tower protection layer 145 may directly contact a lower surface of the base layer 110, and the lower surface of the first lower protection layer 145 may directly contact an upper surface of the second lower protection layer 160 and upper surfaces of the lower conductive pads 153. Also, the first lower protection layer 145 may cover portions of the sidewalls of the through electrode 130 that protrude from the second surface 113 of the base layer 110. As shown in the exemplary embodiment of FIG. 5, the lower surface of the first lower protection layer 145 may be disposed at the same level as a lower surface of the through electrode 130 contacting the lower conductive pad 153.

The first lower protection layer 145 may include an inorganic insulating material to which the compressive stress is applied. Therefore, the first lower protection layer 145 may have compressive stress. In an exemplary embodiment, the first lower protection layer 145 may have the compressive stress applied according to the PECVD process. For example, the first lower protection layer 145 may include at least one of oxide and nitride. For example, the first lower protection layer 145 may include at least one of silicon oxide and silicon nitride. In this exemplary embodiment, to adjust the compressive stress that is applied to the first lower protection layer 145, the process conditions of the PECVD process for forming, the first lower protection layer 145 and/or the thickness of the first lower protection layer 145 may be adjusted.

In an exemplary embodiment, a thickness 145T of the first lower protection layer 145 in the first direction (e.g., the Z direction) may be in a range of about 1.3 μm to about 3.0 μm. For example, the thickness 145T of the first lower protection layer 145 may be in a range of about 1.8 μm to about 2.5 μm.

In an exemplary embodiment, the compressive stress of the first lower protection layer 145 may be in a range of about 100 MPa to about 200 MPa.

In an exemplary embodiment, the insulating layer 125 may have compressive stress that is greater than the compressive stress of the first lower protection layer 145. For example, a difference between the compressive stress of the insulating layer 125 and the compressive stress of the first lower protection layer 145 may be in a range of about 50 MPa to about 150 MPa. In an exemplary embodiment, the PECVD process for forming the insulating layer 125 may be performed at a higher temperature than the PECVD process for forming the first lower protection layer 145 to enable the insulating layer 125 to have greater compressive stress than the first lower protection layer 145. Since the insulating layer 125, which surrounds the metal interconnect pattern 121 having a relatively large volume has a relatively large compressive stress, the tensile stress of the metal interconnect pattern 121 may be effectively cancelled by the compressive stress of the insulating layer 125.

In an exemplary embodiment, the thickness 145T of the first lower protection layer 145 in the Z direction may be in a range of about 13% to about 30% of a thickness 125T of the insulating layer 125 in the Z direction. For example, in an exemplary embodiment in which the thickness 125T of the insulating layer 125 in the Z direction is about 10 μm, the thickness 145I of the first lower protection layer 145 in the Z direction may be in a range of about 1.3 μm to about 3.0 μm. When the thickness 145T of the first lower protection layer 145 in the first direction is less than about 13% of the thickness 125T of the insulating layer 125 in the Z direction, the base layer 110 may not be sufficiently protected. When the thickness 145T of the first lower protection layer 145 in the Z direction is greater than 30% greater of the thickness 125T of the insulating layer 125 in the first direction, the warpage of the interposer 100 may be unnecessarily increased, such as at room temperature.

In an exemplary embodiment, the first lower protection layer 145 may have a multilayered structure in which insulating layers are sequentially stacked on the second surface 113 of the base layer 110. For example, as shown in the exemplary embodiment of FIG. 6, the first lower protection layer 145 may include a first layer 1451 which directly contacts the second surface 113 of the base layer 110, and a second layer 1452, which is disposed on the first layer 1451 and directly contacts the second lower protection layer 160 and the lower conductive pads 153. In an exemplary embodiment, the first layer 1451 of the first lower protection layer 145 may include silicon oxide having a relatively high adhesion. In this exemplary embodiment, adhesion between the first lower protection layer 145 and the base layer 110 may increase. Also, in an exemplary embodiment, the second layer 1452 of the first lower protection layer 145 may include silicon nitride that is relatively easy to apply relatively high compressive stress through the PECVD process.

The lower conductive pads 153 may be disposed on the lower surface of the first lower protection layer 145. For example, in an exemplary embodiment, the lower conductive pads 153 may be connected to board-interposer connection terminals 183. The lower conductive pads 153 may be spaced apart from each other on the lower surface of the first lower protection layer 145. For example, the lower conductive pads 153 may be spaced apart from each other in a horizontal direction, such as in the X direction and/or the Y direction that are parallel to an upper surface of the first surface 111. In an exemplary embodiment, the lower conductive pads 153 may include, for example, at least one metal selected from the group consisting of W, Al, and Cu. In an exemplary embodiment, a thickness of the lower conductive pad 153 may be between about 3 μm and about 5 μm.

The second lower protection layer 160 may be disposed on the first lower protection layer 145 and the lower conductive pads 153. The second lower protection layer 160 may cover the lower surface of the first lower protection layer 145 that is exposed by the lower conductive pads 153 and side surfaces of the lower conductive pads 153, such as lateral end portions of the lower surface of the lower conductive pads 153 and sidewalls of the lower conductive pads 153. The second lower protection layer 60 may include an opening defined therein which exposes a partial portion of the lower surface of the lower conductive pad 153. For example, as shown in the exemplary embodiment of FIG. 6, the opening of the second lower protection layer 160 may expose a central portion of the lower surface of the lower conductive pad 153. The board-interposer connection terminal 183 may be connected to the lower conductive pad 153 through the opening of the second lower protection layer 160. In an exemplary embodiment, the opening of the second lower protection layer 160 may be a hole formed in the second lower protection layer 160 and may have a horizontal width (e.g., length in the X direction) that is in a range of about 25% to about 45% of a horizontal width (e.g., length in the X direction) of the lower conductive pad 153.

In an exemplary embodiment, the second lower protection layer 160 may include a material that is different from a material for forming the first lower protection layer 145. For example, in an exemplary embodiment, the first lower protection layer 145 may include an inorganic insulating material, and the second lower protection layer 160 may include an organic insulating material. In an exemplary embodiment, the second lower protection layer 160 may include a Photo Imageable Dielectric (PID) such as polyimide. In this exemplary embodiment, the compressive stress of the first lower protection layer 145 may cancel or decrease the tensile stress of the second lower protection layer 160.

As shown in the exemplary embodiment of FIG. 5, the interposer 100 may include lower connection pillars 181 disposed on the lower conductive pads 153. The lower connection pillar 181 may be connected to the lower conductive pad 153 through the opening of the second lower protection layer 160 and may contact a portion of the second lower protection layer 160 covering lateral edges of the lower surface of the lower conductive pad 153. In an exemplary embodiment, the lower connection pillar 181 may function as an Under Bump Metallurgy (UBM). For example, the board-interposer connection terminals 183 for connecting the interposer 100 to a board such as a Printed Circuit Board (PCB) may be attached on the lower connection pillar 181. In an exemplary embodiment, the lower connection pillar 181 may include nickel (Ni), Cu, palladium (Pd), platinum (Pt), gold (Au), or a combination thereof. In some exemplary embodiments, the lower connection pillar 181 may not be formed. In an exemplary embodiment, the thickness of the lower connection pillar 181 may be in a range of about 2.5 µm to about 3.5 µm.

As shown in the exemplary embodiment of FIG. 5, the upper protection layer 171 and the upper conductive pads 1 may be disposed on the upper surface of the interconnect structure 120.

The upper protection layer 171 may cover the upper face of the interconnect structure 120 and a partial portion of each upper conductive pad 173. For example, the upper protection layer 171 may cover a partial portion of an upper surface of each upper conductive pad 173, such as lateral edges of the upper surface of each upper conductive pad 173, and sidewalls thereof. The upper protection layer 171 may protect the interconnect structure 120 and the upper conductive pads 173 from external impact or moisture. The upper protection layer 171 may include an opening exposing a partial portion of the tapper surface of each upper conductive pad 173. For example, as shown in the exemplary embodiment of FIG. 6, the opening of the upper protection layer 171 may expose a central portion of the upper surface of each upper conductive pad 173.

In an exemplary embodiment, the upper protection layer 171 may have compressive stress. For example, the upper protection layer 171 may have compressive stress applied thereon. The upper protection layer 171 may include an insulating material to which the compressive is applied. For example, in an exemplary embodiment, the upper protection layer 171 may include silicon oxide, silicon nitride, or a cos combination thereof. The upper protection layer 171 may have the compressive stress and may adjust the warpage of the interposer 100 together with the insulating layer 125 and the first lower protection layer 145.

The interposer 100 may include upper connection pillars 175 disposed on the upper conductive pads 173. The upper connection pillar 175 may be connected to the upper conductive pad 173 through the opening of the upper protection layer 171 and may contact a portion of the upper protection layer 171 covering the lateral edges of the upper surface of the upper conductive pad 173. In an exemplary embodiment, the upper connection pillar 175 may be a portion to which a chip-interposer connection terminal for connecting a semiconductor device, which is mounted on the interposer 100, to the interposer 100 is attached. In an exemplary embodiment, the upper connection pillar 175 may include Ni, Cu, Pd, Pt, Au, or a combination thereof. However, exemplary embodiments of the present inventive concepts are not limited thereto. For example, in some exemplary embodiments the upper connection pillar 175 may not be formed.

The through electrodes 130 may electrically connect the metal interconnect pattern 121 of the interconnect structure 120 to the lower conductive pads 153. The through electrodes 130 may extend from the first surface 111 to the second surface 113 of the base layer 110 and may vertically penetrate the base layer 110 (e.g., substantially in the Z direction). Also, the through electrodes 130 may further penetrate the first lower protection layer 145 disposed on the second surface 113 of the base layer 110. An upper portion of the through electrode 130 may be connected to a lower surface of the metal interconnect pattern 121 of the interconnect structure 120, and a lower portion of the through electrode 130 may be connected to an upper surface of the lower conductive pad 153.

For example, in an exemplary embodiment, the through electrode 130 may include a conductive plug that penetrates the base layer 110 and the first lower protection layer 145 and has a pillar shape, and a conductive barrier layer having a cylindrical shape and surrounding sidewalls of the conductive plug. In an exemplary embodiment, the conductive barrier layer may include at least one material selected from the group consisting of Ti, TiN, Ta, TaN. Ru, Co, Mn, WN, Ni, and NiB, and the conductive plug may include at least one material selected from the group consisting of a Cu alloy such as Cu, CuSn, CuMg, CuNi, CuZn, CuPd, CuAu, CuRe, or CuW, W, a W alloy, Ni, Ru, and Co. A via insulating layer 131 may be disposed on the sidewalk of the through electrode 130 and may be positioned between the base layer 110 and the through electrode 130 and between the first lower protection layer 145 and the through electrode 130. In an exemplary embodiment, the via insulating layer 131 may include an oxide layer, a nitride layer, a carbide layer, a polymer, or a combination thereof. In an exemplary embodiment, an aspect ratio of the through electrode 130, such as a ratio of a width of the through electrode 130 in a horizontal direction (e.g., the X direction) to a height of the through electrode 130 in a vertical direction (e.g., the Z direction) may be in a range of about 7 to about 9.

As shown in the exemplary embodiments of FIGS. 5-6, the interposer 100 may have a redundancy via structure in which one lower conductive pad 153 is connected to at least two through electrodes 130. In this exemplary embodiment, although any one of the at least two through electrodes 130 is defective, a defect in an electrical connection of the interposer 100 may be prevented as other through electrodes 130 are driven. However, exemplary embodiments of the present inventive concepts are not limited thereto.

In an exemplary embodiment, to adjust the range of the warpage of the interposer 100 according to the temperature change, a ratio between the total volume of the lower conductive pads 153 and the total volume of the metal interconnect pattern 121 may be adjusted. For example, the total volume of the lower conductive pads 153 may be set to be similar to the total volume of the metal interconnect pattern 121 to decrease the range of the warpage of the interposer 100 according to the temperature change. For example, the total volume of the lower conductive pads 153 may be in a range of about 70% to about 100% of the total volume of the metal interconnect pattern 121. For example, the total volume of the lower conductive pads 153 may be in a range of about 1.26 mm$^3$ to about 1.8 mm$^3$.

In an exemplary embodiment, the thicknesses of the lower conductive pads 153 may be uniform. In an exemplary embodiment in which the lower conductive pad 153 has an upper surface that contacts lower surfaces of the first lower protection layer 145 and the through electrode 130, and a lower surface opposite to the upper surface, the upper and lower surfaces of the lower conductive pad 153 may be substantially planar (e.g., extending substantially in the X direction).

As illustrated in the exemplary embodiment of FIG. 7, the lower conductive pads 153 may be arranged on the first lower protection layer 145 in a matrix form, and the lower conductive pads 153 may each have a square shape in a plan view (e.g., in a plane defined in the X and Y directions). The lower conductive pads 153 may be arranged to have a pitch 195 that is predetermined. In an exemplary embodiment in which the lower conductive pads 153 have square shapes, the total volume of the lower conductive pads 153 may be increased in a limited area.

In an exemplary embodiment, a gap 193 (e.g., in the X direction or the Y direction) between adjacent lower conductive pads 153 may be in a range of about 30% to about 70% of a width 191 of the lower conductive pad 153 in a horizontal direction (e.g., the X direction or the direction). In an embodiment in which the gap 193 between the adjacent lower conductive pads 153 is less than about 30% of a width 191 of the lower conductive pads 153 in the horizontal direction, the adjacent lower conductive pads 153 may unintendedly contact each other. When the gap 193 between the adjacent lower conductive pads 153 is greater than about 70% of the width 191 of the lower conductive pads 153 in the horizontal direction, it may be difficult to adjust the total volume of the lower conductive pads 153 to be close to the total volume of the metal interconnect pattern 121. For example, when the pitch 195 of the lower conductive pads 153 is about 180 μm, the width 191 of the lower conductive pad 153 in the horizontal direction may be about 120 μm, and the gap 193 between the neighboring lower conductive pads 153 may be about 60 μm.

Figure 8:
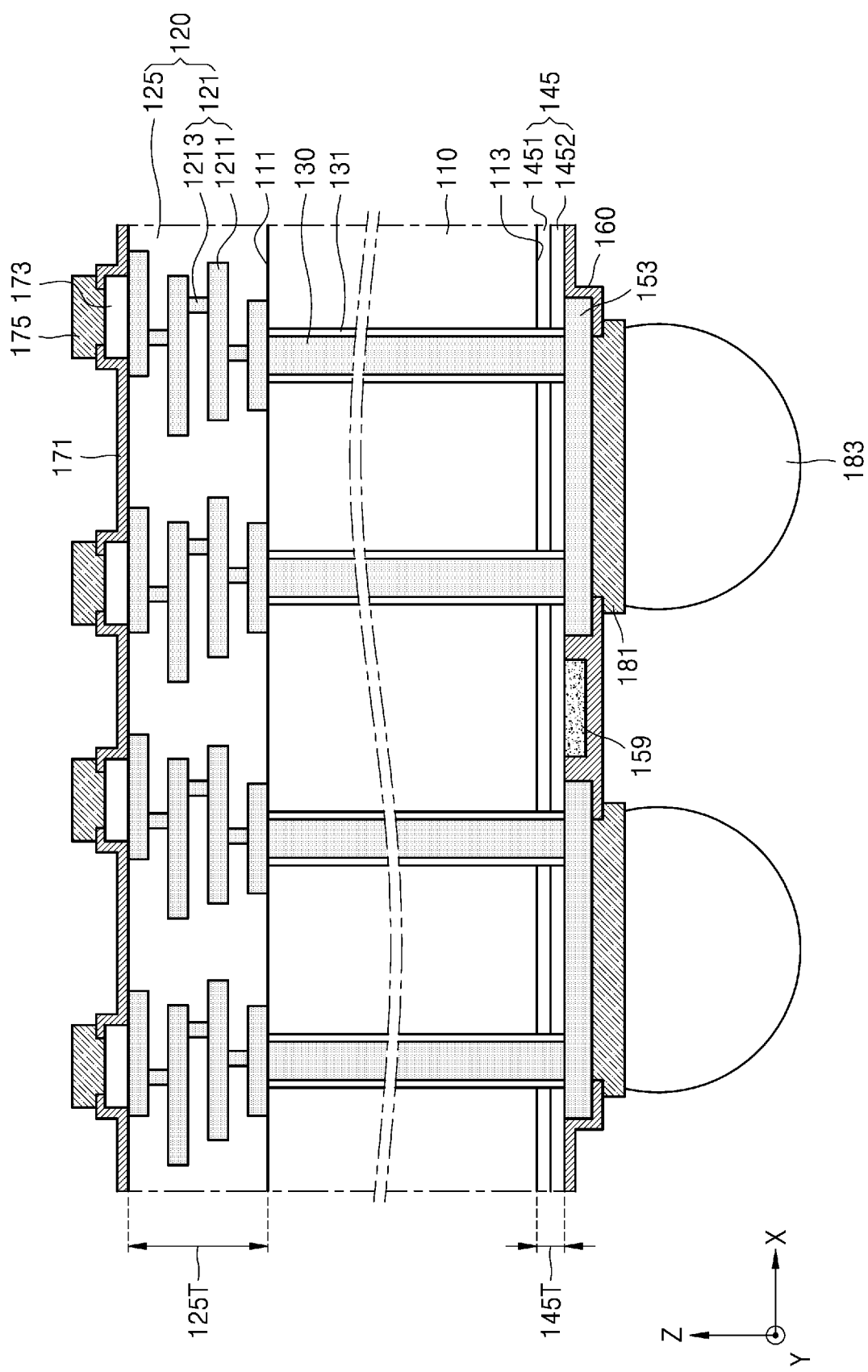
FIG. 8 is a cross-sectional view of an interposer according to an exemplary embodiment of the present inventive concepts.

FIG. 8 is a cross-sectional view of an interposer according to an exemplary embodiment of the present inventive concepts.

The interposer of the exemplary embodiment of FIG. 8 may be similar to the interposer 100 of the exemplary embodiments of FIGS. 5 to 7 except that the interposer of FIG. 8 further includes a conductive dummy pattern 159. Hereinafter, a difference between the interposer of the exemplary embodiment of FIG. 8 and the interposer 100 of the exemplary embodiments of FIGS. 5 to 7 will be mainly described and a description of substantially identical elements may be omitted for convenience of explanation.

Referring to the exemplary embodiment of FIG. 8, the interposer may include the conductive dummy pattern 159 disposed on the first lower protection layer 145. The conductive dummy pattern 159 may be separated from the lower conductive pads 153 and the through electrodes 130. For example, as shown in the exemplary embodiment of FIG. 8, the conductive dummy patter 159 may be spaced apart from the lower conductive pads 153 and the through electrodes 130 in the X direction. The conductive dun a pattern 159 may be electrically insulated from the lower conductive pads 153 and the through electrodes 130. The conductive dummy pattern 159 may be disposed between the lower conductive pads 153 arranged in a matrix form.

The second lower protection layer 160 may fill gaps between the conductive dummy pattern 159 and the lower conductive pads 153 and may separate the conductive dummy pattern 159 from the lower conductive pads 153. For example, as shown in the exemplary embodiment of FIG. 8, the conductive dummy pattern 159 may include an upper surface that directly contacts the first lower protection layer 145 and a lower surface opposite to the upper surface (e.g., in the Z direction). The lower surface of the conductive dummy pattern 159 and a side surface of the conductive dummy pattern 159, such as the sidewalls of the conductive dummy pattern 159, may be covered by the second lower protection layer 160.

In an exemplary embodiment, the conductive dummy pattern 159 may be formed by performing the same process as the process for forming the lower conductive pads 153. In an exemplary embodiment, the conductive dummy pattern 159 may include the same material as the lower conductive pads 153 and may be disposed at the same level as the lower conductive pads 153.

To adjust the warpage of the interposer, a sum of the total volume of the lower conductive pads 153 and the total volume of the conductive dummy pattern 159 may be adjusted to be similar to the total volume of the metal interconnect pattern 121. In an exemplary embodiment, the sum of the total volume of the lower conductive pads 153 and the total volume of the conductive dummy pattern 159 may be in a range of about 70% to about 100% of the total volume of the metal interconnect pattern 121.

As the interposer is heated, the warpage of the conductive dummy pattern 159, which is caused by the thermal expansion, and the warpage of the metal interconnect pattern 121, which is caused by the thermal expansion, may extend in opposite directions. Therefore, the warpage of the conductive dummy pattern 159, which is caused by the thermal expansion, and the warpage of the lower conductive pads 153, which is caused by the thermal expansion, may cancel or decrease the warpage of the metal interconnect pattern 121 caused by the thermal expansion.

Figure 9:
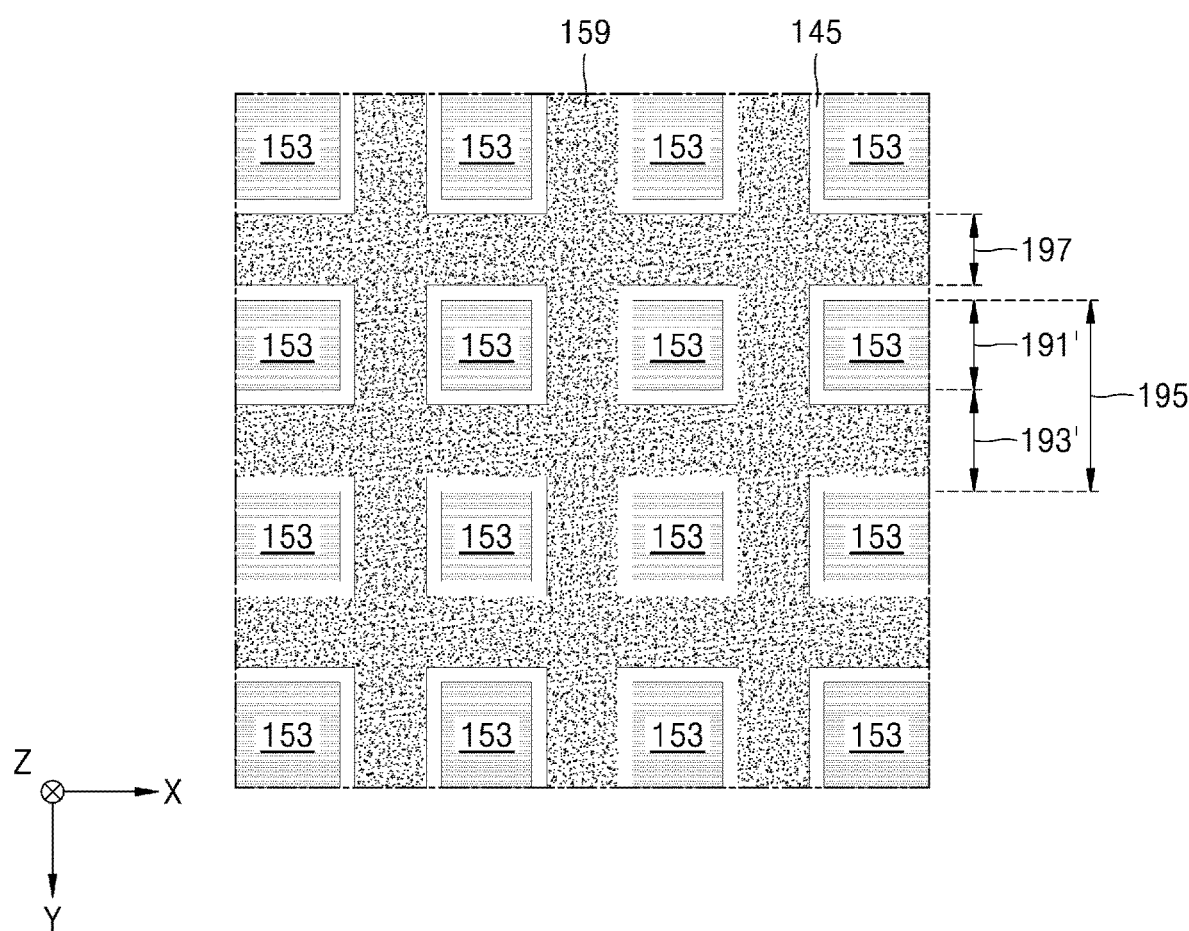
FIGS. 9 and 10 are plan views of an example arrangement of lower conductive pads and a conductive dummy pattern, according to exemplary embodiments of the present inventive concepts.
Figure 10:
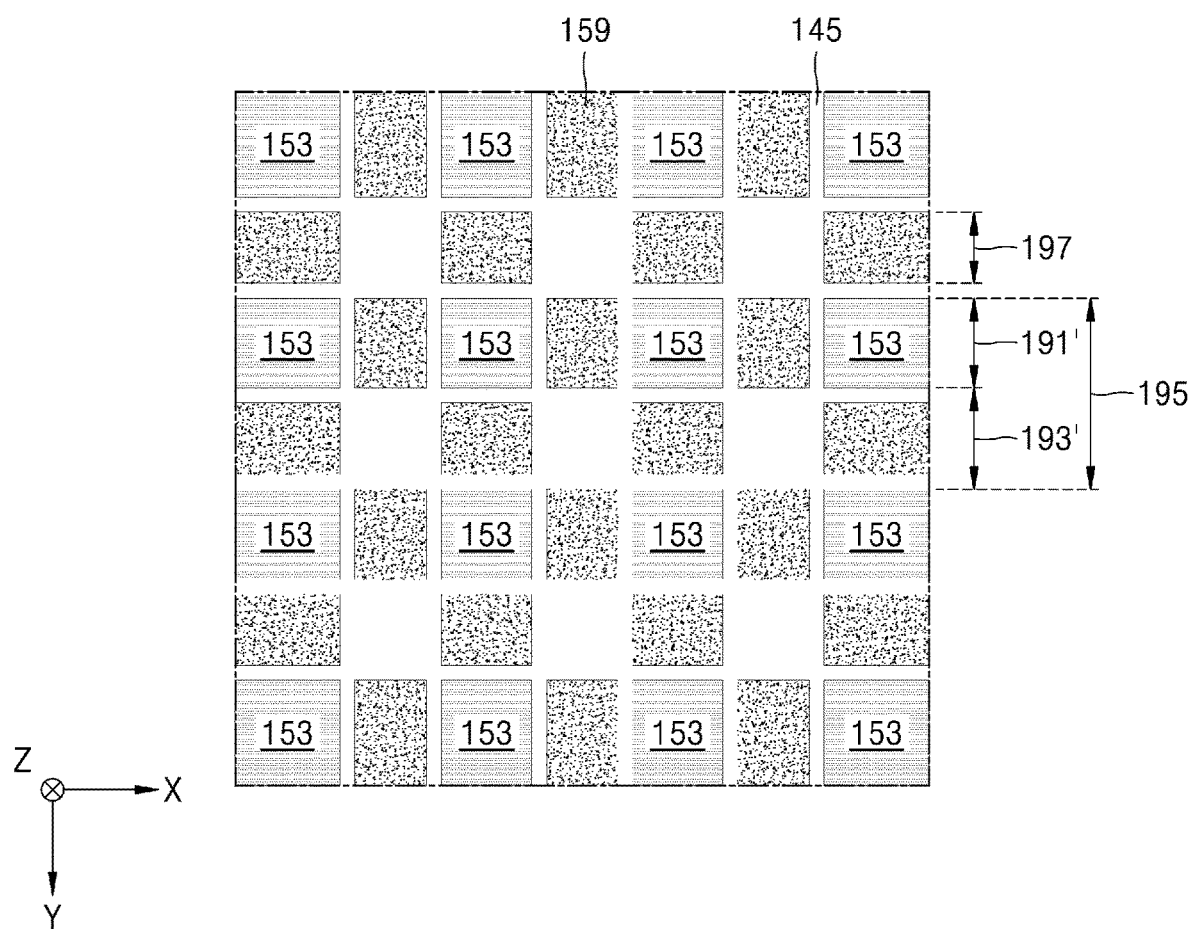

FIGS. 9 and 10 are plan views of an example arrangement of the lower conductive pads 153 and the conductive dummy pattern 159, according to exemplary embodiments of the present inventive concepts.

Referring to the exemplary embodiment of FIG. 9, the conductive dummy pattern 159 may extend along the side surfaces of the lower conductive pads 153. For example, as shown in the exemplary embodiment of FIG. 9, the conductive dummy pattern 159 may extend along side surfaces of the lower conductive pads 153 extending in both the X and Y directions. The conductive dummy pattern 159 may extend along the side surfaces of each lower conductive pad 153. The conductive dummy pattern 159 may surround each lower conductive pad 153 in a plan view (e.g., in a plane defined in the X and directions). For example, in a plan view (e.g., in a plane defined in the X and Y directions), the conductive dummy pattern 159 may form a cavity in which at least one lower conductive pad 153 is accommodated in the cavity. In the exemplary embodiment of FIG. 9, one lower conductive pad 153 is located in each cavity formed by the conductive dummy pattern 159. However, exemplary embodiments of the present inventive concepts are not limited thereto and two or more lower conductive pads 153 may be located in one cavity formed by the conductive dummy pattern 159 in other exemplary embodiments.

The pitch 195 of the lower conductive pads 153 may be identical to the pitch 195 of the lower conductive pads 153 of the exemplary embodiment of FIG. 7. However, a width 191' of the lower conductive pads 153 may be less than a width 191 of the lower conductive pads 153 of FIG. 7, and a gap 193' between the adjacent lower conductive pads 153 may be greater than the gap 193 between the adjacent lower conductive pads 153 of FIG. 7. For example, when the pitch 195 of the lower conductive pads 153 is about 180 μm, a width 191' of the lower conductive pad 153 in the horizontal direction may be about 100 μm, and the gap 193' between the adjacent lower conductive pads 153 may be about 80 μm.

For example, a width 197 of the conductive dummy pattern 159 may be about 50 μm. However, exemplary embodiments of the present inventive concepts are not limited thereto. The width 197 of the conductive dummy pattern 159 may be appropriately adjusted to make the total volume of the conductive dummy pattern 159 have a predetermined value.

Referring to the exemplary embodiment of FIG. 10, the conductive dummy pattern 159 may include unit patterns that are spaced apart from each other. Each unit pattern of the conductive dummy pattern 159 may be disposed between two adjacent lower conductive pads 153. FIG. 10 illustrates that one unit pattern is disposed between two adjacent lower conductive pads 153 (e.g., in the X and Y direction). However, unlike the exemplary embodiment of FIG. 10, there may be gaps between adjacent unit patterns in the X and Y directions and there may not be a conductive dummy pattern 159 disposed between some pairs of the lower conductive pads 153 that are diagonally adjacent to each other (e.g., in a direction between the X and Y directions). However, exemplary embodiments of the present inventive concepts are not limited thereto and the gaps between the unit patterns of the conductive dummy pattern 159 may be variously arranged.

Figure 11:
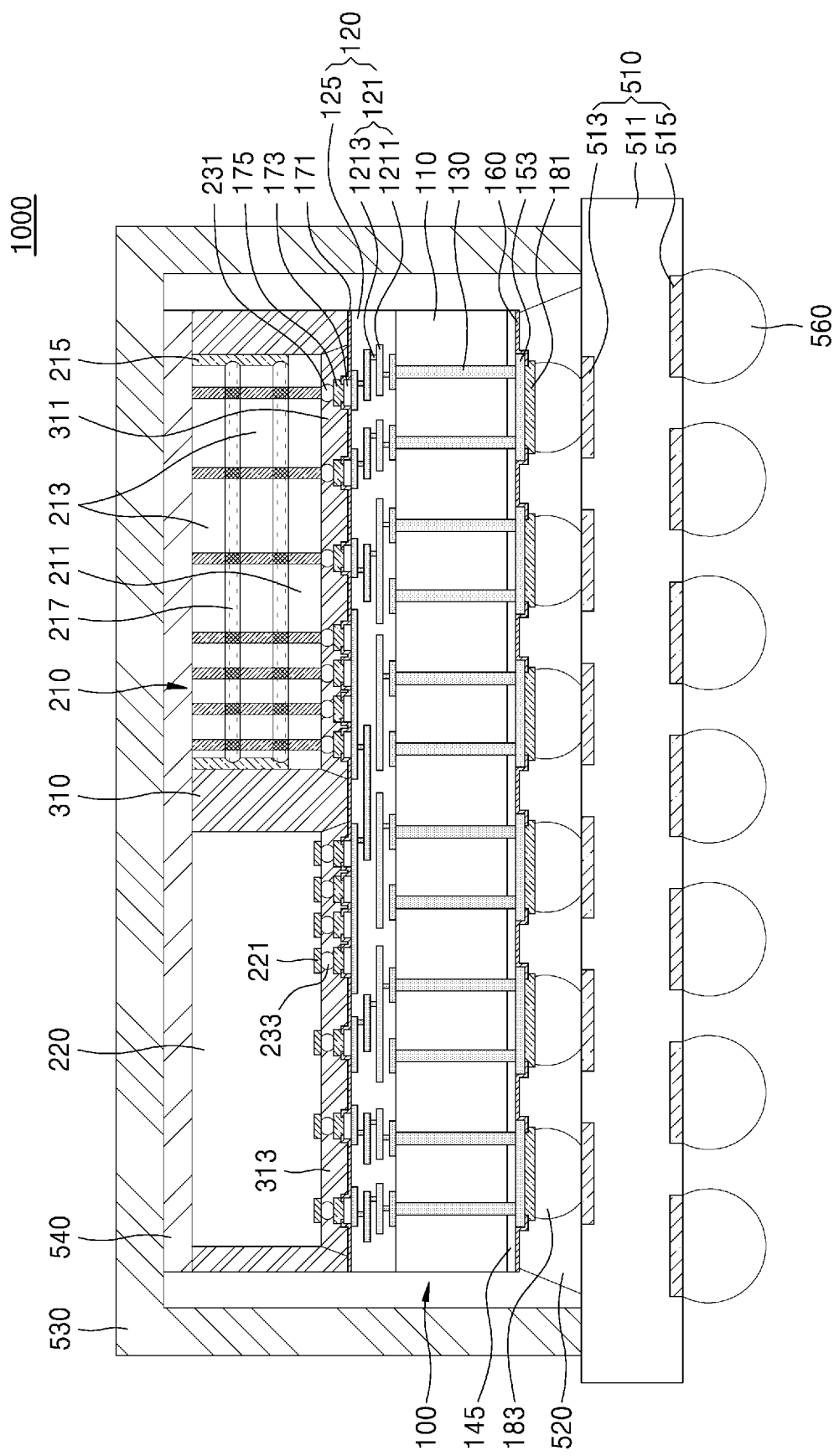
FIG. 11 is a cross-sectional view of a semiconductor package according to an exemplary embodiment of the present inventive concepts.

FIG. 11 is a cross-sectional view of a semiconductor package 1000 according to an exemplary embodiment of the present inventive concepts.

Referring to the exemplary embodiment of FIG. 11, the semiconductor package 100 may include a package substrate 510, the interposer 100 mounted on the package substrate 510, and first and second semiconductor devices 210 and 220 mounted on the interposer 100. The semiconductor package 1000 of the exemplary embodiment of FIG. 11 includes the interposer 100 described with reference to the exemplary embodiments of FIGS. 5 to 7. However, exemplary embodiments of the present inventive concepts are not limited thereto and the semiconductor package 1000 may include the interposer of the exemplary embodiments of FIGS. 8 to 10 in other exemplary embodiments.

As shown in the exemplary embodiment of FIG. 11, the first semiconductor device 210 and the second semiconductor device 220 may be spaced apart from each other on the interconnect structure 120 of the interposer 100 in the horizontal direction. The first semiconductor device 210 and the second semiconductor device 220 may be electrically connected to each other through the metal interconnect pattern 121 of the interconnect structure 120. The first semiconductor device 210 may be mounted on the interposer 100 through a first chip connection terminal 231, and the second semiconductor device 220 may be mounted on the interposer 100 through a second chip connection terminal 233 attached to a pad 221 of the second semiconductor device 220 A first underfill material layer 311 surrounding the first chip connection terminals 231 may be disposed between the first semiconductor device 210 and the interposer 100, and a second underfill material layer 313 surrounding the second chip connection terminals 233 may be disposed between the second semiconductor device 220 and the interposer 100.

While the exemplary embodiment of FIG. 11 illustrates an example in which two semiconductor devices are mounted on the interposer 100, exemplary embodiments of the present inventive concepts are not limited thereto. For example, in other exemplary embodiment, the semiconductor package 1000 may include three or more semiconductor devices disposed on the interposer 100.

In an exemplary embodiment, the first semiconductor device 210 may be a stacked memory device. For example, the first semiconductor device 210 may include a buffer die 211 and core dies 213. For example, in an exemplary embodiment, the buffer die 211 may be referred to as an interface die, a base die, a logic die, a master die, or the like, and each core die 213 may be referred to as a memory die, a slave die, or the like. FIG. 11 illustrates that the first semiconductor device 210 includes two core dies 213, but the number of core dies 213 may vary in other exemplary embodiments. For example, in another exemplary embodiment, the first semiconductor device 210 may include four, eight, twelve, or sixteen core dies 213.

The buffer die 211 and the core dies 213 may include through silicon vias (TSVs). The buffer die 211 and the core dies 213 may be stacked through the TSVs and may be electrically connected to each other. Accordingly, the first semiconductor device 210 may have a three-dimensional (3D) memory structure in which multiple dies are stacked. For example, the first semiconductor device 210 may be realized according to High Bandwidth Memory (HEM) standards or Hybrid Memory Cube (HMC) standards.

Each core die 213 may include a memory cell array. The buffer die 211 may include a physical layer and a direct access area. The physical layer of the buffer die 211 may include interface circuits for a connection with an external host device and may be electrically connected to the second semiconductor device 220 through the interposer 100. The first semiconductor device 210 may receive signals from the second semiconductor device 220 through the physical layer or may transmit signals to the second semiconductor device 220. The signals and/or data received through the physical layer of the buffer die 211 may be transmitted to the core dies 213 through the TSVs. The direct access area may provide an access path via which the first semiconductor device 210 may be tested without using the second semiconductor device 220. The direct access area may include a conductive means (e.g., a port or a pin) that may directly communicate with the external test device.

An insulating adhesion layer 217 may be disposed between the buffer die 211 and the core die 213 or between the core dies 213. In an exemplary embodiment, the insulating adhesion layer 217 may include, for example, a Non Conductive Film (NCF), a Non Conductive Paste (NCP), an insulating polymer, or epoxy resin. The first semiconductor device 210 may include a molding layer 215 that covers a side surface of the buffer die 211 and side surfaces of the core dies 213. For example, as shown in the exemplary embodiment of FIG. 11, the molding layer 215 may cover lateral ends of the upper surface of the buffer die 211 and sidewalk of the core dies 213. In an exemplary embodiment, the molding layer 215 may include, for example, epoxy mold compound (EMC).

In an exemplary embodiment, the second semiconductor device 220 may be, for example, a system-on-chip, a central processing unit (CPU) chip, a graphics processing unit (GPU) chip, or an application processor (AP) chip.

The second semiconductor device 220 may execute applications supported by the semiconductor package 1000 by using the first semiconductor device 210. For example, in an exemplary embodiment, the second semiconductor device 220 may execute specialized arithmetic operations by including at least one of a CPU, an AP, a GPU, a Neural Processing Unit (NPU), a Tensor Processing Unit (TPU), a Vision Processing Unit (VPU), an image Signal Processor (ISP), and a Digital Signal Processor (DSP).

The second semiconductor device 220 may include a physical layer and a memory controller. The physical layer of the second semiconductor device 220 may include input/ output circuits for receiving/transmitting signals from/to the physical layer of the first semiconductor device 210. The second semiconductor device 220 may provide various signals to the physical layer of the first semiconductor device 210 through the physical layer of the second semiconductor device 220. For example, the memory controller may control all operations of the first semiconductor device 210. The memory controller may transmit signals for controlling the first semiconductor device 210 to the First semiconductor device 210 through the metal interconnect pattern 121 of the interposer 100.

The semiconductor package 1000 may further include a package molding layer 310 disposed on the interposer 100 which molds the first semiconductor device 210 and the second semiconductor device 220. In an exemplary embodiment, the package molding layer 310 may include, for example, an EMC. As shown in the exemplary embodiment of FIG. 11, the package molding layer 310 may cover the upper surface of the interposer 100, the lateral side surface of the first semiconductor device 210, and the lateral side surface of the second semiconductor device 220, but may not cover upper surfaces of the first and second semiconductor devices 210 and 220.

The semiconductor package 1000 may further include a heat dissipation member 530 that is disposed on an upper surface of the package substrate 510 and covers the upper surfaces of the first and second semiconductor devices 210 and 220. The heat dissipation member 530 may include a heat dissipation plate such as a heat slug or a heat sink. In an exemplary embodiment, the heat dissipation member 530 may surround, on the upper surface of the package substrate 510, the first semiconductor device 210, the second semiconductor device 220, and the interposer 100.

Also, the semiconductor package 1000 may further include a thermal interface material (TIM) 540. The TIMs 540 may be disposed between an upper surface of the heat dissipation member 530 and the first semiconductor device 210 (e.g., in a thickness direction of the package substrate 510) and between an upper surface of the heat dissipation member 530 and the second semiconductor device 220 (e.g., in a thickness direction of the package substrate 510).

The package substrate 510 may be electrically connected to the interposer 100 through the board-interposer connection terminal 183. An underfill material layer 520 may be disposed between the interposer 100 and the package substrate 510. The underfill material layer 520 may surround the board-interposer connection terminals 183.

The package substrate 510 may include a substrate base 511, and substrate upper and lower pads 513 and 515 which are disposed on upper and lower surfaces of the substrate base 511, respectively. In an exemplary embodiment, the package substrate 510 may be a printed circuit board (PCB). For example, the package substrate 510 may be a multi-layer PCB. In an exemplary embodiment, the substrate base 511 may include at least one of phenol resin, epoxy resin, and polyimide. The substrate tipper pad 513 may be connected to the board-interposer connection terminal 183, and the substrate lower pad 515 may be connected to the package connection terminal 560 that electrically connects an external terminal to the semiconductor package 1000.

Figure 12A:
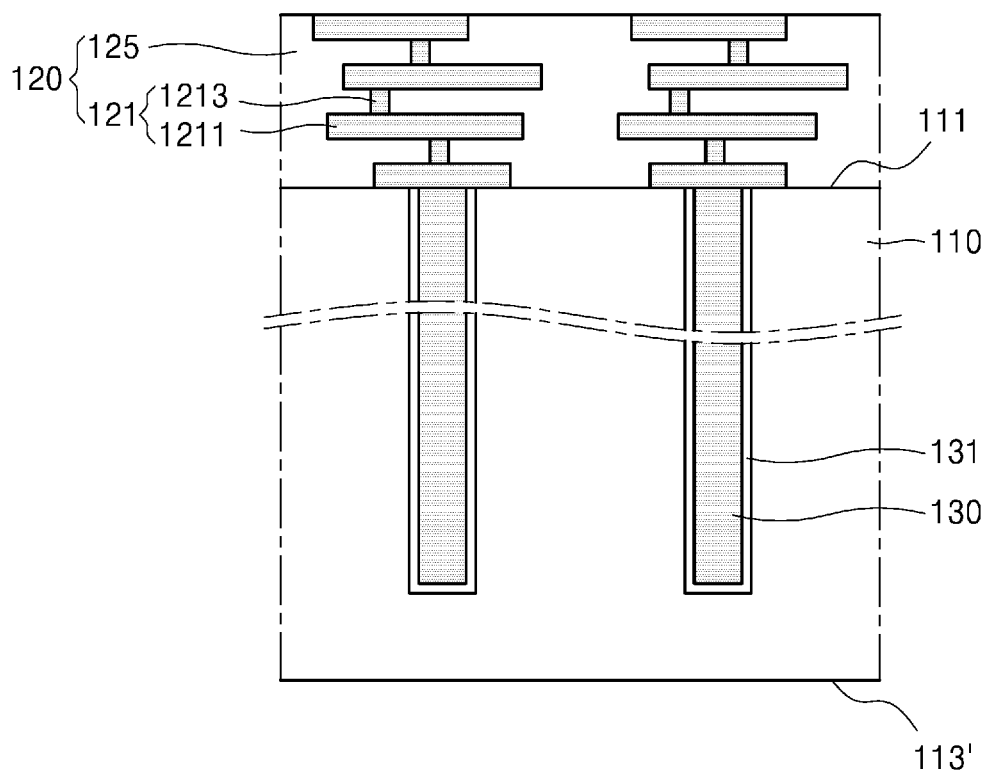
FIGS. 12A to 12H are cross-sectional views of a manufacturing method of an interposer according to exemplary embodiments of the present inventive concepts.

According to an exemplary embodiment of the present inventive concepts, the warpage of the interposer 100 may be controlled by adjusting (i) a ratio of the total volume of the lower conductive pads 153 to the total volume of the metal interconnect pattern 121 and/or (ii) the compressive stress and the thicknesses of the insulating layer 125 and the first lower protection layer 145. For example, in all predetermined temperature sections, the ratio of the total volume of the metal interconnect pattern 121 to the total volume of the lower conductive pads 153 may be adjusted, and the compressive stress applied to the insulating layer 125 and the first lower protection layer 145 may be adjusted so that the warpage of the interposer 100 is within a predetermined range. For example, the predetermined range of the warpage of the interposer 100 may be in a range of about −70 μm to about +70 μm. Since the warpage of the interposer 100 is controllable to be within a predetermined range, the semiconductor package 1000 including the interposer 100 may have an increased reliability, FIGS. 12A to 12H are cross-sectional views of a manufacturing method of the interposer 100 according to exemplary embodiments of the present inventive concepts. Referring to FIGS. 12A to 1214, examples of a manufacturing method of the interposer 100 of FIGS. 5 to 7 will be described.

Referring to the exemplary embodiment of FIG. 12A, the through electrode 130 is formed in the base layer 110 of the interposer 100. For example, in an exemplary embodiment, the base layer 110 may be a silicon wafer. The through electrode 130 may extend from the first surface 111 of the base layer 110 to a second surface 113' thereof, but may not penetrate the base layer 110. For example, a bottom portion of the through electrode 130 may be spaced apart from the second surface 113 and the through electrode 130 may not extend through the second surface 113'.

In an exemplary embodiment, after the through electrode 130 is formed, a redistribution process may be performed to form the interconnect structure 120 on the first surface 111 of the base layer 110. The interconnect structure 120 may include the metal interconnect pattern 121 and the insulating layer 125 surrounding the metal interconnect pattern 121. The metal interconnect pattern 121 may include the conductive line patterns 1211, which are spaced apart from each other in a vertical direction to form a multilayered structure, for example, a structure of four layers, and the conductive vias 1213 extending in the vertical direction to connect the conductive line patterns 1211.

In an exemplary embodiment, a PECVD process may be performed to form the insulating layer 125. As the PECVD process is performed, the compressive stress applied to the insulating layer 125 may be adjusted by controlling process conditions such as a temperature and pressure. In an exemplary embodiment, the insulating layer 125 may include silicon oxide.

Figure 12B:
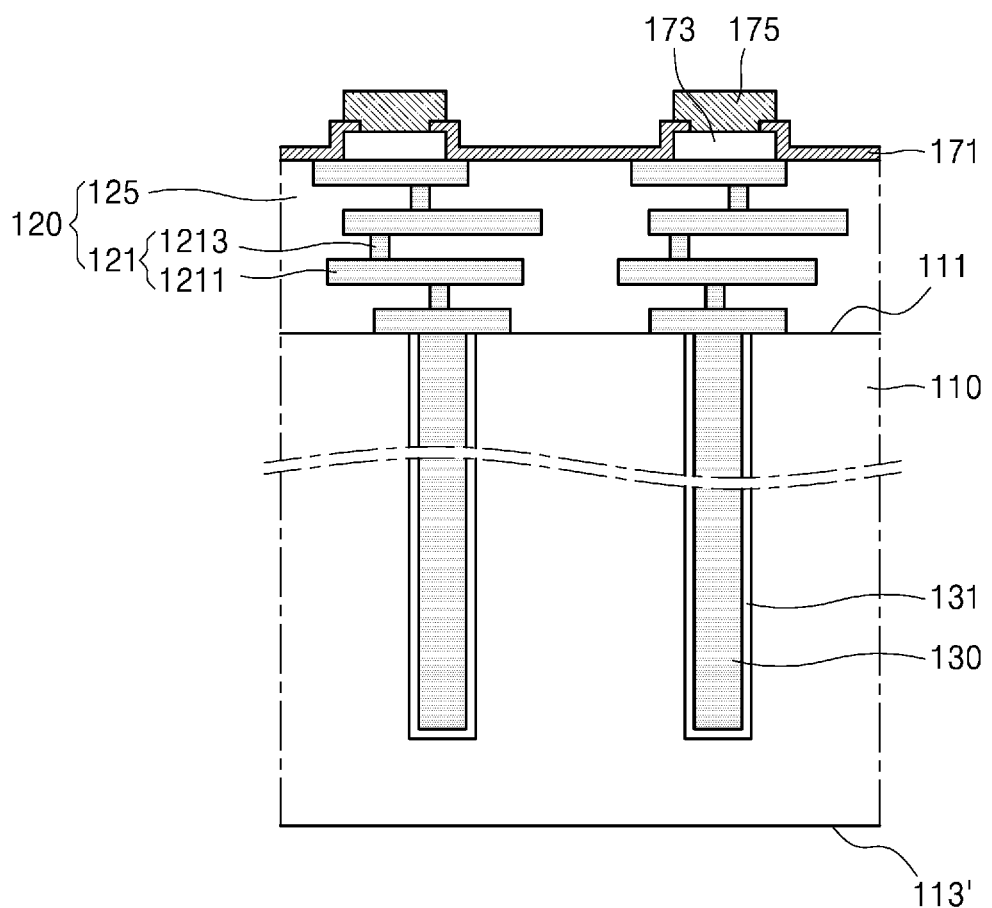

Referring to the exemplary embodiment of FIG. 12B, after the interconnect structure 120 is formed, the upper conductive pad 173 is formed on the interconnect structure 120. For example, in an exemplary embodiment, the upper conductive pad 173 may be formed by timing a conductive layer on the interconnect structure 120. The conductive layer may then be patterned to form the upper conductive pad 173. In an exemplary embodiment, the upper conductive pad 173 may include Al, Ni, Cu, or a combination thereof.

After the upper conductive pad 173 is formed, an upper protection layer 171 may then be formed on the interconnect structure 120. The upper conductive layer 171 may cover an upper surface of the interconnect structure 120 and a partial portion of the upper conductive pad 173, such as sidewalls and lateral ends of the upper surface of the upper conductive pad 173. The upper protection layer 171 may have an opening through which the upper surface of the upper conductive pad 173 is partially exposed. For example, the opening may be in a central portion of the upper surface of the upper conductive pad 173.

In an exemplary embodiment, the PECVD process may be performed to form the upper protection layer 171. As the PECVD process is performed, the compressive stress applied to the upper protection layer 171 may be adjusted by controlling the process conditions such as a temperature and pressure. In an exemplary embodiment, the upper protection layer 171 may include silicon oxide, silicon nitride, or a combination thereof.

After the upper protection layer 171 is formed, an upper connection pillar 175 may be formed on the upper protection layer and the upper conductive pad 173. The upper connection pillar 175 is electrically connected to the upper conductive pad 173 exposed through the opening of the upper protection layer 171. For example, in an exemplary embodiment, the upper connection pillar 175 may be formed by forming a seed metal layer on the upper conductive pad 173 and the upper protection layer 171. A mask pattern which exposes a portion of the upper connection pillar 175 may then be formed and a conductive material layer, which is formed through a plating process in which the seed metal layer is used as a seed, may be formed, thereby removing the mask pattern and a portion of the seed metal layer that is disposed under the mask pattern.

Figure 12C:
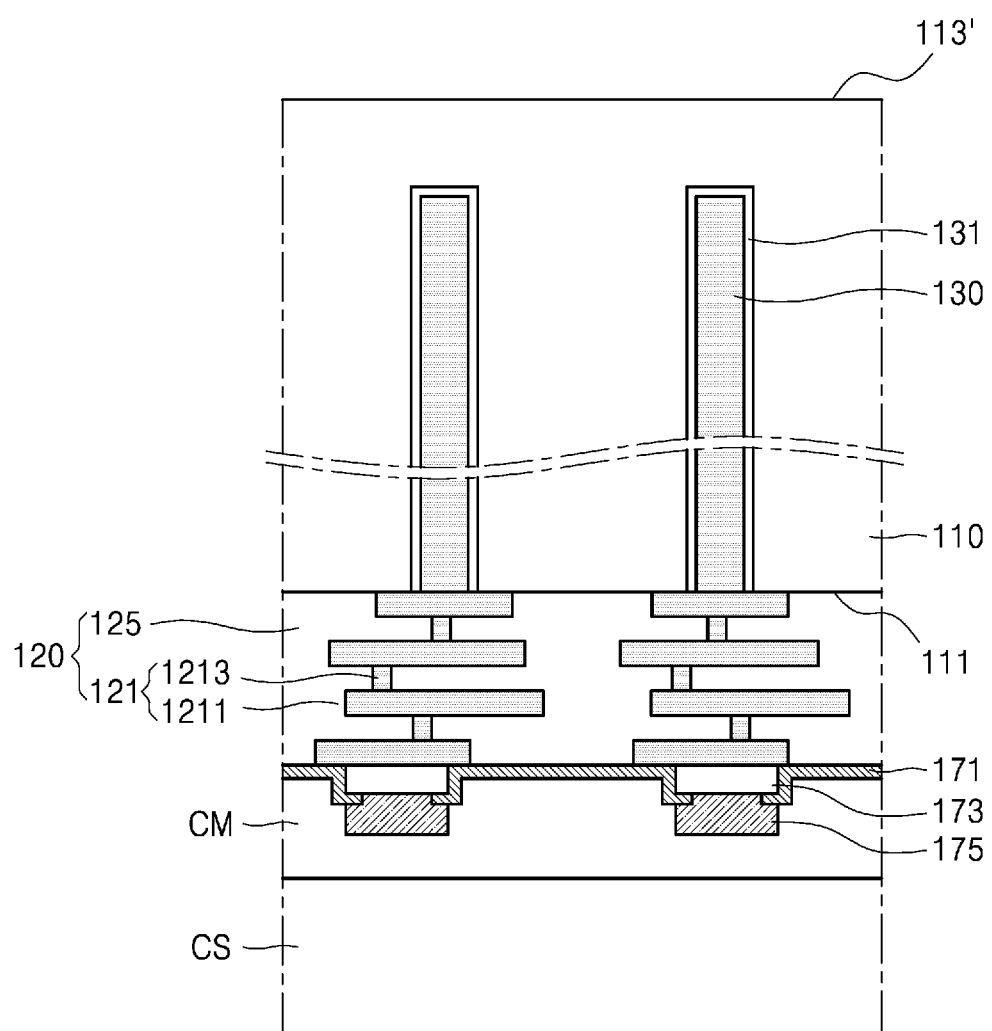

Referring to the exemplary embodiment of FIG. 12C, the product shown in the exemplary embodiment of FIG. 12B may be attached to a carrier substrate CS. The product of the exemplary embodiment of FIG. 12B may be attached to the carrier substrate CS to enable the first surface 111 of the base layer 110 to face the carrier substrate CS. In an exemplary embodiment, the carrier substrate CS may be, for example, a semiconductor substrate, a glass substrate, a ceramic substrate, or a plastic substrate.

Figure 12D:
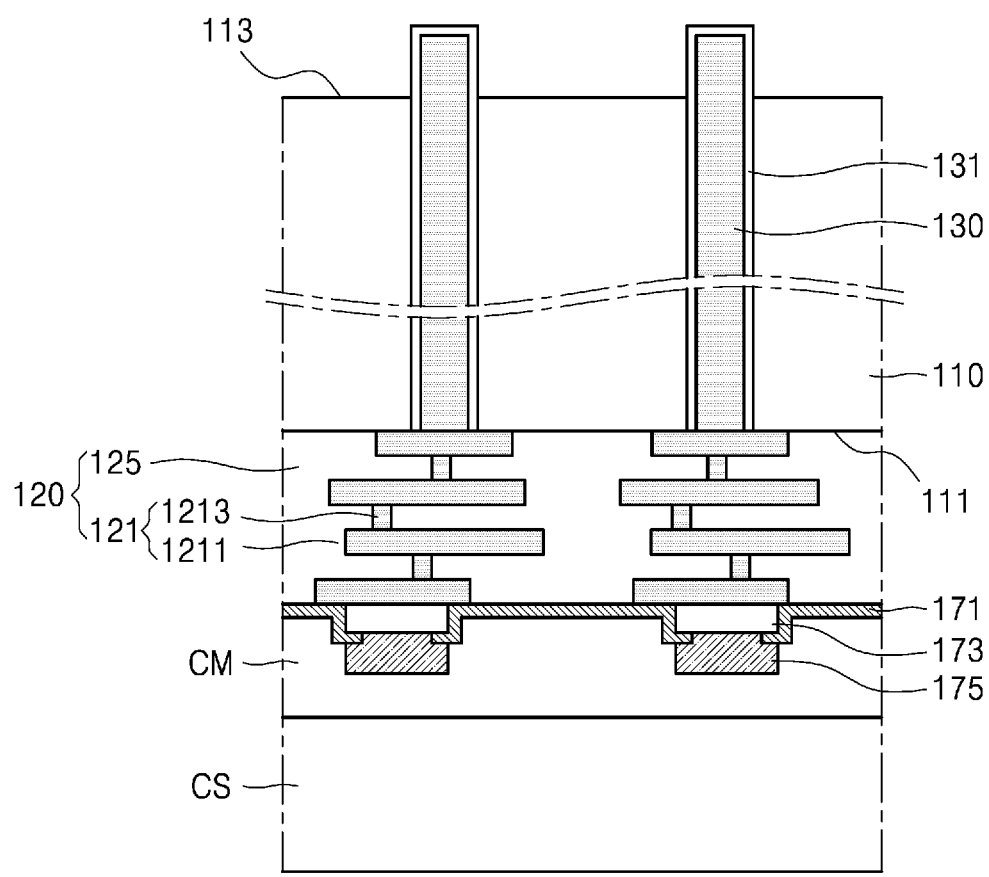

Referring to the exemplary embodiment of FIG. 12D, a portion of the base layer 110 may be removed to expose the through electrode 130. For example, an upper portion of the base layer 110 may be removed to expose an upper surface of the through electrode 130. As a portion of the base layer 110 is removed, the through electrode 130 may be exposed through the second surface 113 of the base layer 110 and may penetrate the base layer 110.

The through electrode 130 may protrude from the second surface 113 of the base layer 110. For example, a planarization process, such as a CMP process, may be performed on the product of the exemplary embodiment of FIG. 12C to remove a portion of the base layer 110 until the through electrode 130 is exposed. The CMP process may be further performed to remove upper portions of the base layer 110 to expose sidewalls of the through electrode 130.

Figure 12E:
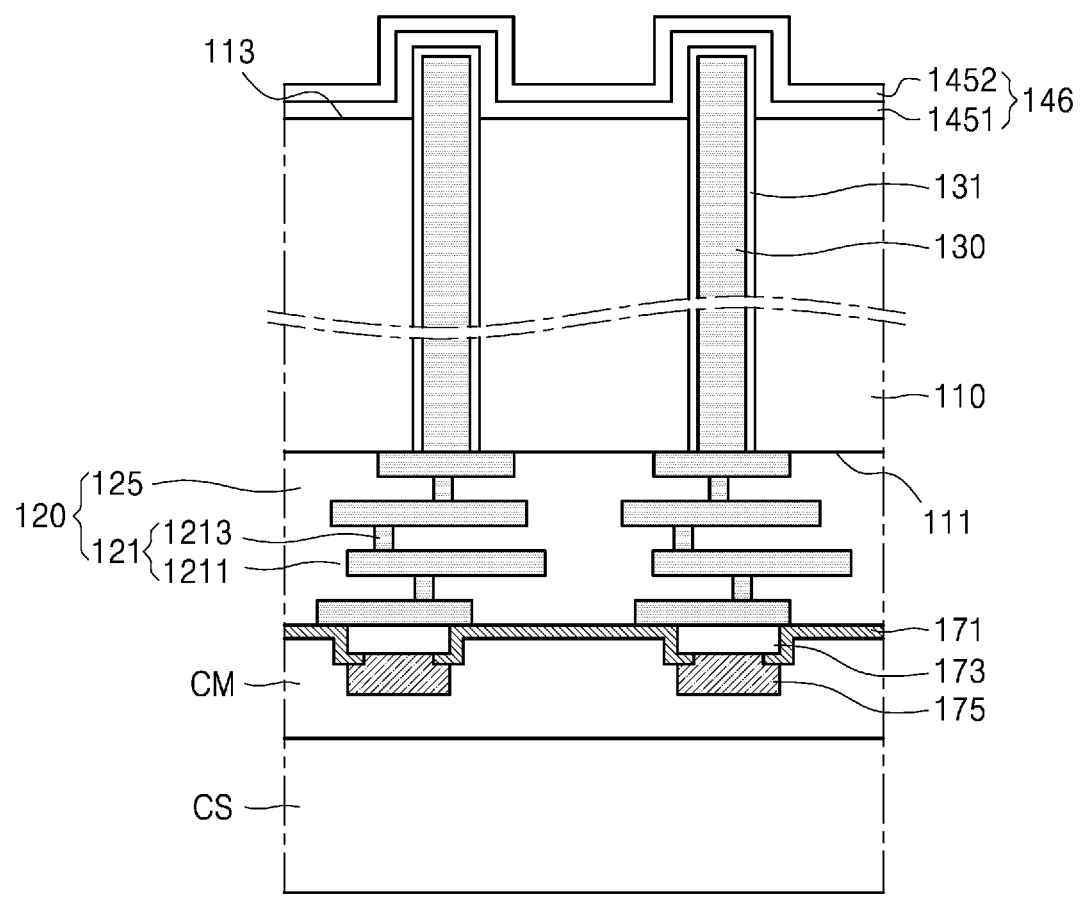
Figure 12F:
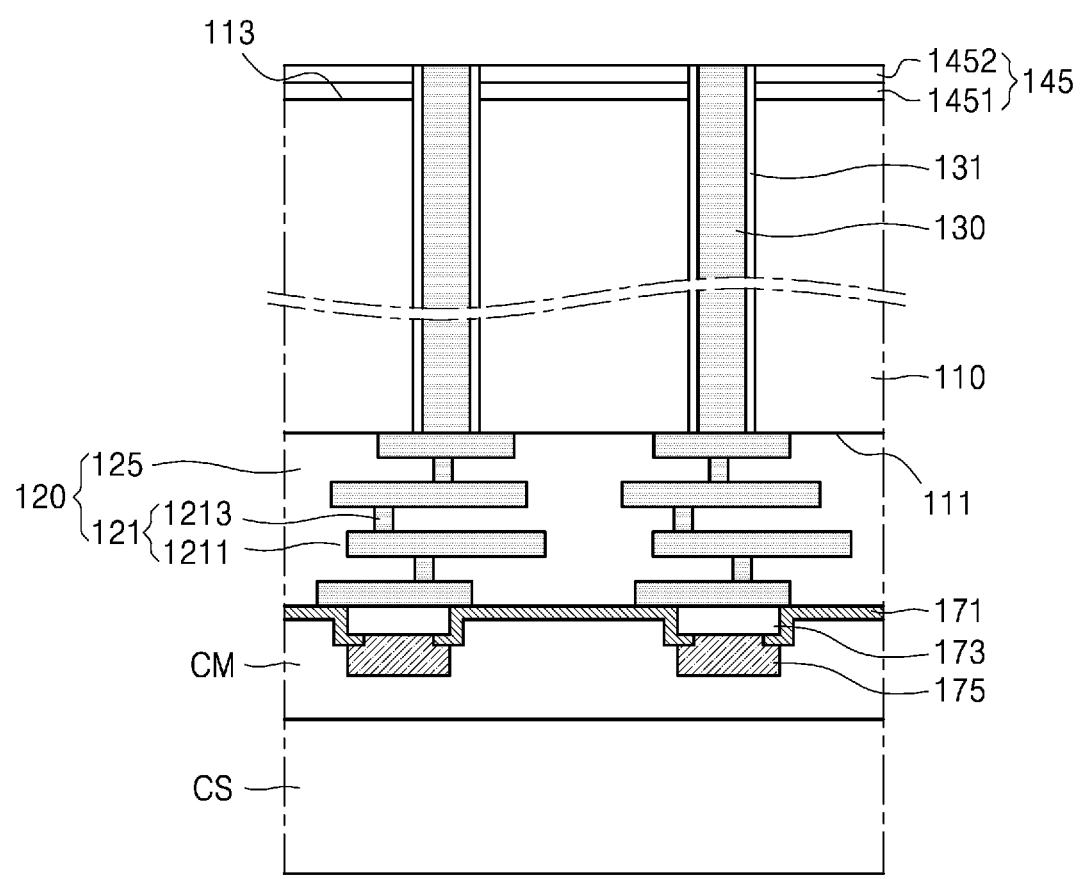

Referring to the exemplary embodiment of FIG. 12E, a first preliminary lower protection layer 146 is formed on the exposed portions of the through electrode 130 and the upper portion of the base layer 110. For example, the first preliminary lower protection layer 146 may cover the second surface 113 of the base layer 110 and the portion of the through electrode 130 protruding from the second surface 113 of the base layer 110.

In an exemplary embodiment, the PECVD process may be performed to form the first preliminary lower protection layer 146. While the PECVD process is performed, the compressive stress applied to the first preliminary lower protection layer 146 may be adjusted by controlling process conditions such as temperature and pressure. In an exemplary embodiment, the first preliminary lower protection layer 146 may include silicon oxide, silicon nitride, or a combination thereof.

For example, the PECVD process may be performed to form the first preliminary lower protection layer 146. While the PECVD process is performed, the compressive stress applied to the first preliminary lower protection layer 146 may be adjusted by controlling the process conditions such as a temperature and pressure. In an exemplary embodiment, the first preliminary lower protection layer 146 may include silicon oxide, silicon nitride, or a combination thereof. In an exemplary embodiment, the first preliminary lower protection layer 146 may include a first layer 1451 and a second layer 1452 which are stacked on each other. The first layer 1451 may include silicon oxide, and the second layer 1452 may include silicon nitride.

In an exemplary embodiment, the PECVD process for forming the first preliminary lower protection layer 146 may be performed at a lower temperature than the PECVD process for forming the insulating layer 125. For example, when the PECVD process for forming the insulating layer 125 is performed at a temperature of about 400° C., the PECVD process for forming the first preliminary lower protection layer 146 may be performed at a temperature of about 180° C. In this exemplary embodiment, the first preliminary lower protection layer 146 may have compressive stress that is less than the compressive stress of the insulating layer 125. Since the PECVD process for forming the first preliminary lower protection layer 146 is performed at a relatively low temperature, the deterioration of an adhesion material layer CM may be prevented.

In general, when a process requiring a high temperature is performed while a wafer is fixed on the carrier substrate CS by using the adhesion material layer CM, there is a risk (e.g., an unfill risk) that the adhesion material layer CM is not filled between the carrier substrate CS and an edge portion of the wafer due to the warpage of the wafer. However, according to an exemplary embodiment of the present inventive concepts, the unfill risk may be reduced during the manufacture of the interposer by controlling warpage of an intermediate structure of the interposer attached to the carrier substrate CS by using the insulating layer 125 to which the compressive stress is applied.

Referring to the exemplary embodiments of FIGS. 12E and 2F, a partial portion of the first preliminary lower protection layer 146 may be removed to expose the through electrode 130. For example, an upper portion of the first preliminary lower protection layer 146 may be removed to expose the through electrode 130. After the partial portion of the first preliminary lower protection layer 146 is removed, the first lower protection layer 145, which covers the second surface 113 of the base layer 110 and the sidewall of the through electrode 130 protruding from the second surface 113 of the base layer 110, may be formed.

For example, to expose the through electrode 130, a polishing process such as a CMP process may be performed. As a result of the polishing process, a surface of the exposed through electrode 130 may be on the same plane as an upper surface of the first lower protection layer 145.

Figure 12G:
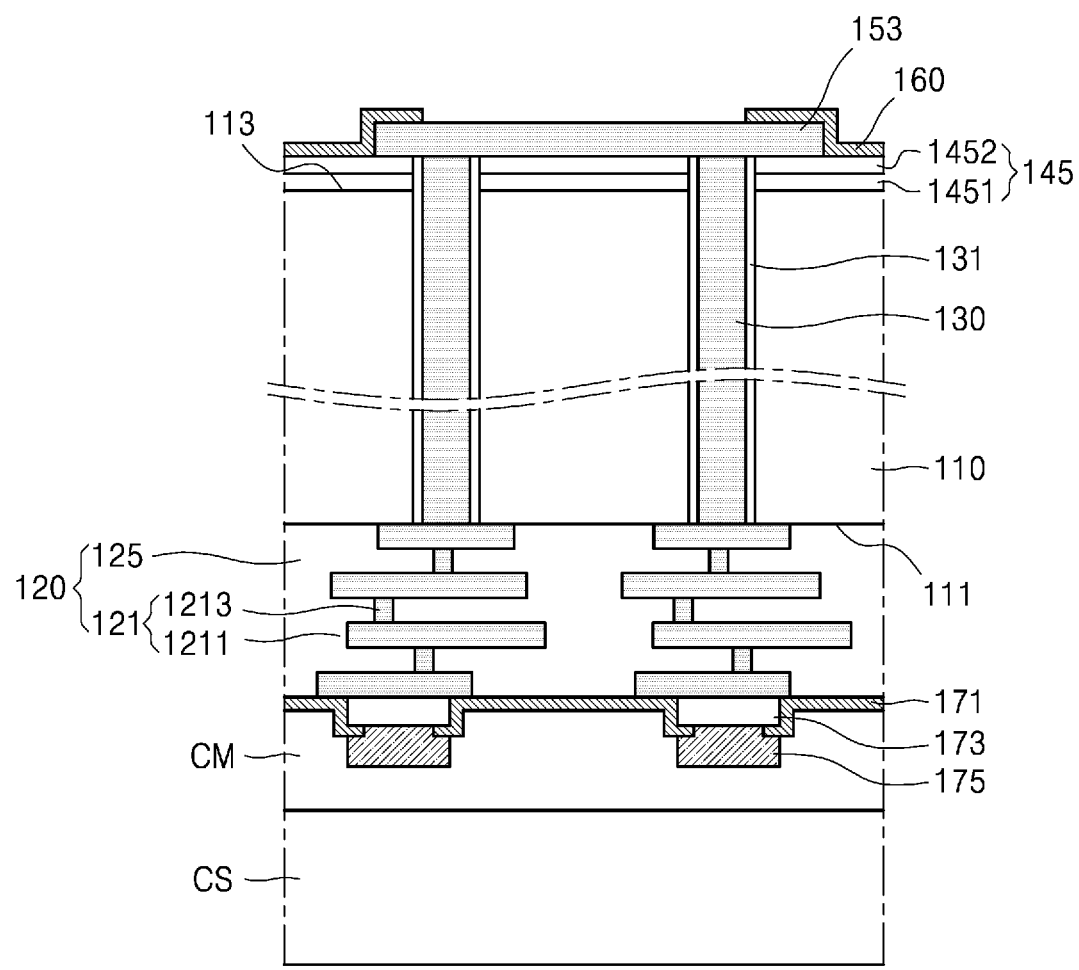

Referring to the exemplary embodiment of FIG. 12G, the lower conductive pad 153, which is electrically connected to the through electrode 130 is formed on the first lower protection layer 145 and an upper surface of the through electrode 130. For example in an exemplary embodiment, a conductive layer may be formed on the first lower protection layer 145, and a patterning process tray then be performed on the conductive layer to form the lower conductive pad 153.

After the lower conductive pad 153 is formed, the second lower protection layer 160 is formed on the first lower protection layer 145 and the lower conductive pad 153. The second lower protection layer 160 may cover the first lower protection layer 145 and a partial portion of the lower conductive pad 153. For example, the second lower protection layer 160 may cover lateral end portions of the upper surface of the lower conductive pad 153. The second lower protection layer 160 may have an opening through which the lower conductive pad 153 is partially exposed. For example, the opening, of the second lower protection layer 160 may overlap a central portion of the lower conductive pad 153. In an exemplary embodiment, the second lower protection layer 160 may include an organic material. For example, the second lower protection layer 160 may include PID such as polyimide.

Figure 12H:
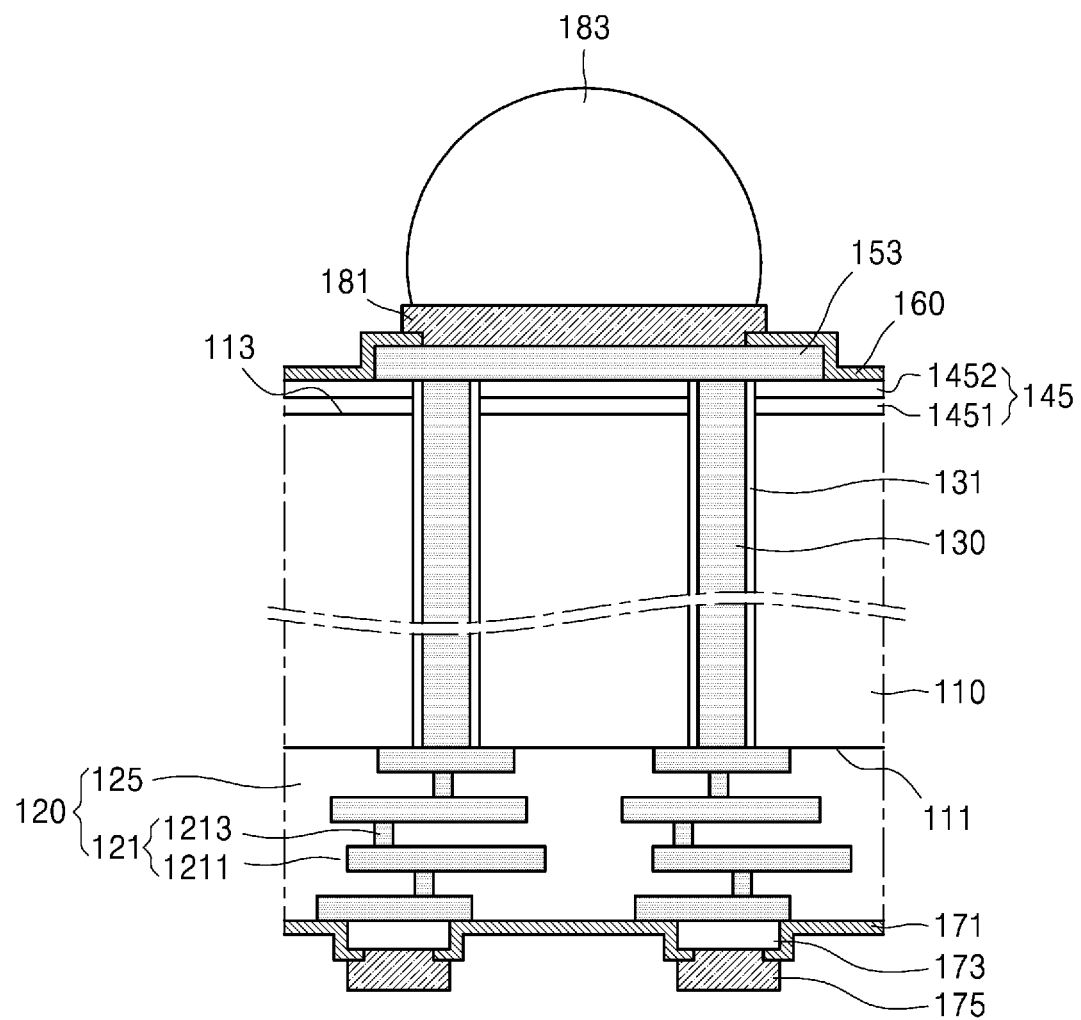

Referring to the exemplary embodiments of FIGS. 12G and 12H, the lower connection pillar 181 may be formed an the portion of the lower conductive pad 153 exposed through the opening of the second lower protection layer 160 and the second lower protection layer 160. The board-interposer connection terminal 183 may be formed on the lower connection pillar 181. In an exemplary embodiment, the board-interposer connection terminal 183 may be formed as a solder ball or a solder bump. The interposer 100 of the exemplary embodiments of FIGS. 5 to 7 may then be formed by removing the adhesion material layer CM and the carrier substrate CS.

Figure 13A:
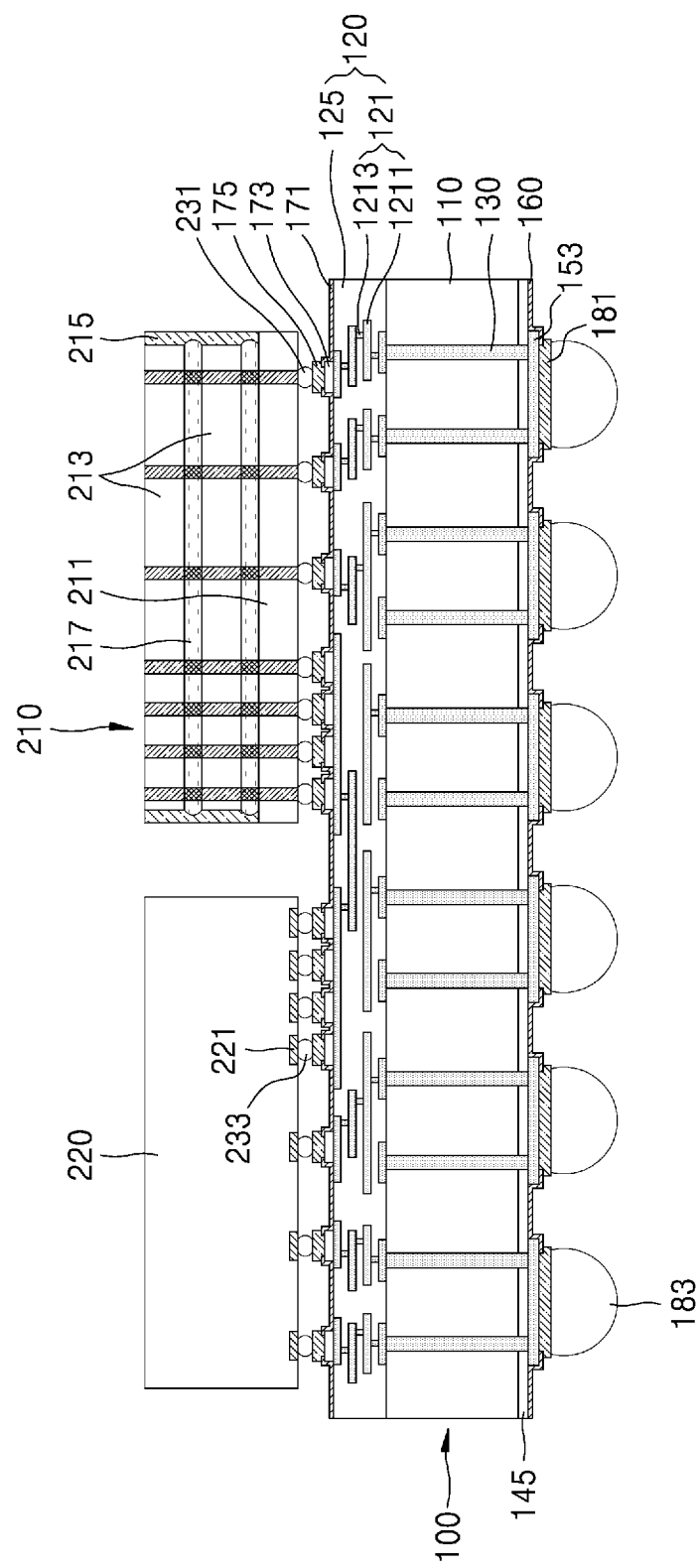
FIGS. 13A and 13B are cross-sectional views of a manufacturing method of a semiconductor package according to exempla embodiments of the present inventive concepts.
Figure 13B:
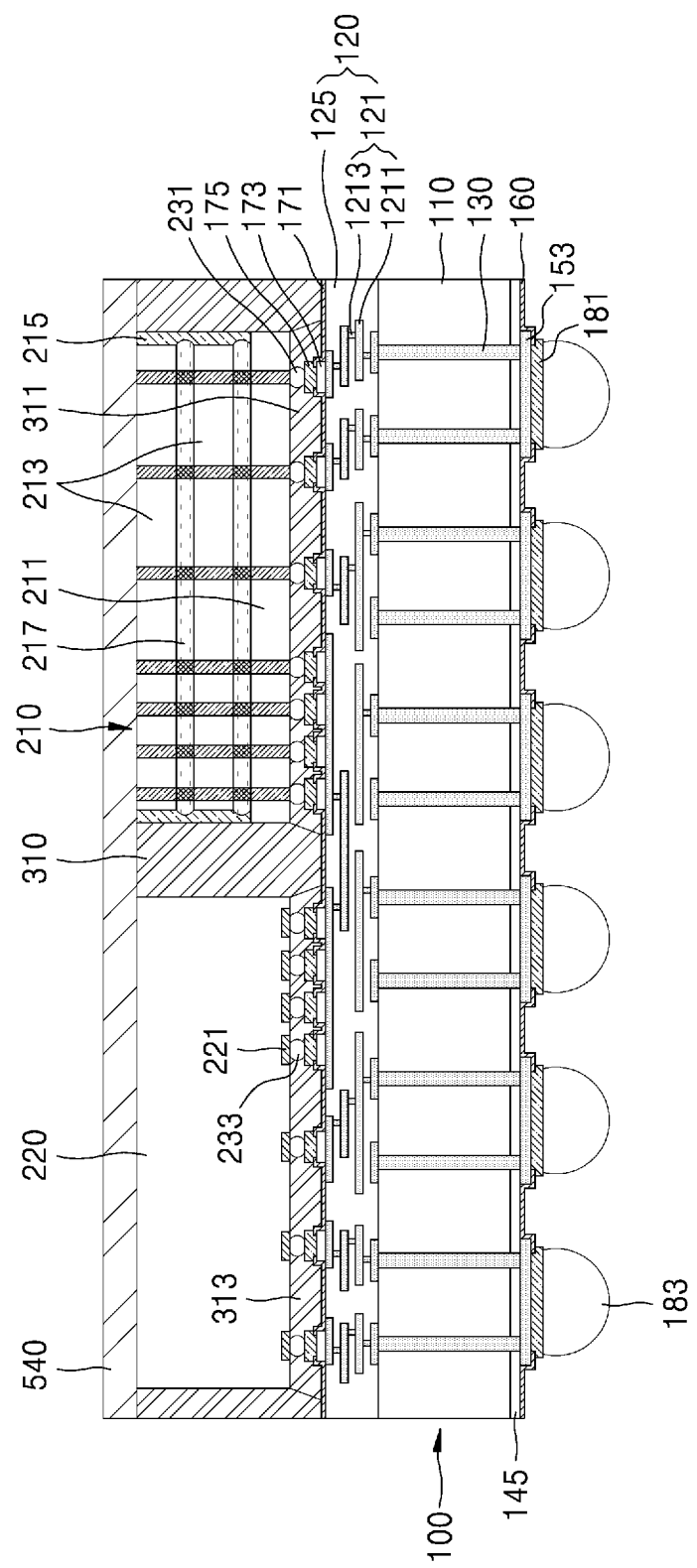

FIGS. 13A and 13B are cross-sectional views of a manufacturing method of a semiconductor package, according to exemplary embodiments of the present inventive concepts.

Referring to the exemplary embodiment of FIG. 13A, the first semiconductor device 210 and the second semiconductor device 220 are mounted on the interposer 100. In an exemplary embodiment, the first semiconductor device 210 and the second semiconductor device 220 may be semiconductor dies that are diced respectively and individualized, or may each be a sub-packet into which at least one semiconductor die is molded. For example, the first semiconductor device 210 may be electrically connected to the metal interconnect pattern 121 of the interposer 100 through the first chip connection terminal 231 attached to the upper connection pillar 175, and the second semiconductor device 220 may be electrically connected to the metal interconnect pattern 121 of the interposer 100 through the second chip connection terminal 223 attached to the upper connection pillar 175. In an exemplary embodiment, the first chip connection terminal 231 and the second chip connection terminal 223 may each be a solder ball or a solder hump.

Referring to the exemplary embodiment of FIG. 13B, after the first semiconductor device 210 and the second semiconductor device 220 are mounted on the interposer 100, an underfill process may be performed in which the first underfill material layer 311, which fills a gap between the first semiconductor device 210 and the interposer 100, and the second underfill material layer 313, which fills a gap between the second semiconductor device 220 and the interposer 100 are formed. The package molding layer 310 which covers the side surfaces of the first and second semiconductor devices 210 and 220, are then formed on the interposer 100. The package molding layer 310 may include, for example, an EPC.

After the package molding layer 310 is formed, the TIM 540 may be formed on the upper surface of the first semiconductor device 210, the upper surface of the second semiconductor device 220, and the upper surface of the package molding layer 310.

As illustrated in the exemplary embodiment of FIG. 11, the interposer 100 is mounted on the package substrate 510. The interposer 100 may be mounted on the package substrate 510 through the board-interposer connection terminal 183. The underfill material layer 520, which surrounds the board-interposer connection terminal 183, may be formed between the interposer 100 and the package substrate 510. The heat dissipation member 530, which surrounds the first semiconductor device 210, the second semiconductor device 220, and the interposer 100, may then be attached to the upper surface of the package substrate 510 and the heat dissipation member 530.

In manufacturing processes of a semiconductor package using a general interposer, a relatively large warpage is generated during a process, for example, a reflow process, which requires a high temperature. Due to such warpage, the adhesion reliability between the interposer and the semiconductor devices degrades. However, according to an exemplary embodiment of the present inventive concepts, the warpage of the interposer 100 may be adjusted to be in an appropriate range by adjusting (i) a ratio of the total volume of the lower conductive pads 153 to the total volume of the metal interconnect pattern 121 and/or (ii) the compressive stress applied to the insulating layer 125 and the first lower protection layer 145 and the thicknesses thereof. Therefore, the reliability of the semiconductor package of the interposer 100 may be increased.

While the present inventive concepts have been particularly illustrated and described with reference to exemplary embodiments thereof it will be understood that various changes in form and details may be made therein without departing from be spirit and scope of the following claims.

What is claimed is:

1. An interposer comprising:
a base layer including a first surface and a second surface that are opposite to each other;
an interconnect structure disposed on the first surface of the base layer, the interconnect structure including a metal interconnect pattern and an insulating layer surrounding the metal interconnect pattern;
a first lower protection layer disposed on the second surface of the base layer;
a plurality of lower conductive pads disposed on the first lower protection layer;
a second lower protection layer disposed directly on the first lower protection layer and the plurality of lower conductive pads, the second lower protection layer includes an organic material; and
a plurality of through electrodes that penetrate the base layer and the first lower protection layer, the plurality of through electrodes is configured to electrically connect the metal interconnect pattern of the interconnect structure to the plurality of lower conductive pads,
wherein at least one of the insulating layer and the first lower protection layer has compressive stress, and
wherein a thickness of the first lower protection layer is in a range of about 13% to about 30% of a thickness of the insulating layer.

2. The interposer of claim 1, wherein:
the insulating layer and the first lower protection layer both have the compressive stress; and
the compressive stress of the insulating layer is greater than the compressive stress of the first lower protection layer.

3. The interposer of claim 1, wherein a total volume of the plurality of lower conductive pads is in a range of about 70% to about 100% of a total volume of the metal interconnect pattern.

4. The interposer of claim 1, further comprising:
the second lower protection layer contacting side surfaces of the plurality of lower conductive pads and the first lower protection layer and having an opening defined in the second lower protection layer; and a plurality of connection terminals connected to the plurality of lower conductive pads through the opening of the second lower protection layer.

5. The interposer of claim 4, wherein:
the insulating layer and the first lower protection layer include inorganic materials.

6. The interposer of claim 4, wherein:
the first lower protection layer contacts portions of sidewalls of the plurality of through electrodes that protrude from the second surface of the base layer; and
lower surfaces of the plurality of through electrodes are positioned at a same level as a lower surface of the first lower protection layer.

7. The interposer of claim 4, wherein:
the plurality of lower conductive pads comprise upper surfaces that contact the first lower protection layer and lower surfaces that contact the plurality of connection terminals; and
the upper and lower surfaces of the plurality of lower conductive pads are substantially planar.

8. The interposer of claim 1, wherein:
the first lower protection layer comprises a first layer and a second layer that are sequentially stacked on the second surface of the base layer,
wherein the first layer comprises silicon oxide and the second layer comprises silicon nitride.

9. The interposer of claim 1, wherein each of the plurality of lower conductive pads is connected to at least two through electrodes of the plurality of through electrodes.

10. The interposer of claim 1, further comprising a conductive dummy pattern disposed on the first lower protection layer, the conductive dummy pattern is separated from the plurality of lower conductive pads and the plurality of through electrodes.

11. The interposer of claim 1, wherein:
the insulating layer and the first lower protection layer both have the compressive stress;
the compressive stress of the insulating layer is in a range of about 150 MPa to about 250 MPa; and
the compressive stress of the first lower protection layer is in a range of about 100 MPa to about 200 MPa.

* * * * *